United States Patent
Suzuki et al.

(10) Patent No.: US 9,217,053 B2
(45) Date of Patent: Dec. 22, 2015

(54) ACTIVE ESTER RESIN, THERMOSETTING RESIN COMPOSITION, CURED PRODUCT OF SAME, SEMICONDUCTOR ENCAPSULATION MATERIAL, PREPREG, CIRCUIT BOARD, AND BUILD-UP FILM

(71) Applicant: DIC Corporation, Tokyo (JP)

(72) Inventors: Etsuko Suzuki, Ichihara (JP); Kazuo Arita, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/386,476

(22) PCT Filed: Mar. 19, 2013

(86) PCT No.: PCT/JP2013/057853
§ 371 (c)(1),
(2) Date: Jan. 7, 2015

(87) PCT Pub. No.: WO2013/141247
PCT Pub. Date: Sep. 26, 2013

(65) Prior Publication Data
US 2015/0118499 A1 Apr. 30, 2015

(30) Foreign Application Priority Data
Mar. 21, 2012 (JP) .................. 2012-063539

(51) Int. Cl.
*B32B 27/08* (2006.01)
*H05K 1/05* (2006.01)
(Continued)

(52) U.S. Cl.
CPC .. *C08G 8/32* (2013.01); *C08G 8/28* (2013.01); *C08G 16/0243* (2013.01); *C08G 16/04* (2013.01); *C08J 5/24* (2013.01); *C08L 61/14* (2013.01); *H01L 23/293* (2013.01); *H05K 1/0353* (2013.01); *H05K 1/056* (2013.01);
(Continued)

(58) Field of Classification Search
None
See application file for complete search history.

(56) References Cited

U.S. PATENT DOCUMENTS

2012/0095156 A1 4/2012 Hayashi et al.

FOREIGN PATENT DOCUMENTS

JP 07-082348 A 3/1995
JP 2008-291279 A 12/2008
(Continued)

OTHER PUBLICATIONS

Nakamura et al., JP 2012-251133 machine translation. Dec. 20, 2012.*

(Continued)

*Primary Examiner* — Coris Fung
(74) *Attorney, Agent, or Firm* — Locke Lord LLP

(57) ABSTRACT

A cured product exhibits good heat resistance and flame retardancy as well as low dielectric constant and low loss tangent. A phosphorus-containing compound (i) obtained by a reaction between an aromatic aldehyde (a1) having an alkoxy group as a substituent on a nucleus and an organic phosphorus compound (a2) having a P—H group or a P—OH group in a molecular structure is reacted with a phenolic substance (a3) to obtain a phosphorus-containing phenolic substance (A1). Then the phosphorus-containing phenolic substance (A1) is reacted with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phenolic substance (A1) form ester bonds.

9 Claims, 10 Drawing Sheets

(51) Int. Cl.
*C08L 63/00* (2006.01)
*C08G 8/32* (2006.01)
*C08J 5/24* (2006.01)
*H01L 23/29* (2006.01)
*H05K 1/03* (2006.01)
*C08G 16/02* (2006.01)
*C08L 61/14* (2006.01)
*H05K 3/00* (2006.01)
*C08G 8/28* (2006.01)
*C08G 16/04* (2006.01)

(52) U.S. Cl.
CPC .......... *H05K3/0067* (2013.01); *C08G 2190/00* (2013.01); *C08L 2201/02* (2013.01); *C08L 2203/206* (2013.01); *H01L 2924/0002* (2013.01); *H05K 2201/012* (2013.01); *H05K 2201/0145* (2013.01)

(56) References Cited

FOREIGN PATENT DOCUMENTS

| | | | |
|---|---|---|---|
| JP | 2011-157434 A | | 8/2011 |
| JP | 2012251133 | * | 12/2012 |
| JP | 2013-040270 A | | 2/2013 |
| WO | WO-2010/106698 A1 | | 9/2010 |
| WO | WO-2012/002119 A1 | | 1/2012 |

OTHER PUBLICATIONS

International Search Report mailed Jun. 4, 2013, issued for PCT/JP2013/057853.

* cited by examiner

ACTIVE ESTER RESIN, THERMOSETTING RESIN COMPOSITION, CURED PRODUCT OF SAME, SEMICONDUCTOR ENCAPSULATION MATERIAL, PREPREG, CIRCUIT BOARD, AND BUILD-UP FILM

TECHNICAL FIELD

The present invention relates to a thermosetting resin composition a cured product of which exhibits good flame retardancy, heat resistance, and low loss tangent and which has good solubility in solvents, a cured product thereof, an active ester resin used in the thermosetting resin composition, a semiconductor sealing material containing the thermosetting resin composition, a prepreg, a circuit board, and a build-up film.

BACKGROUND ART

Epoxy resin compositions containing epoxy resins and curing agents for the epoxy resins as essential components exhibit good heat resistance and insulating properties when cured and thus are widely used in electronic part usages such as semiconductors and multilayer printed boards.

Among the electronic part usages, the technical field of the multilayer printed board insulating materials has recently seen an increase in the speed of signals and frequencies in various electronic appliances. However, with the increase in speed of signals and frequencies, it has become difficult to obtain low loss tangent while maintaining a sufficiently low dielectric constant.

Accordingly, it is desirable to provide a thermosetting resin composition that can be cured into a cured product that exhibits a sufficiently low loss tangent while maintaining a sufficiently low dielectric constant for signals with higher speed and higher frequencies. Regarding the material that can achieve low dielectric constant and low loss tangent, a technique of using, as an epoxy resin curing agent, an active ester compound obtained by aryl-esterification of phenolic hydroxyl groups in a phenol novolac resin is known in the art (refer to PTL 1 below).

Under trends toward higher frequencies and size-reduction of electronic parts, multilayer printed board insulating materials are also required to exhibit a significantly high level of heat resistance. However, the aforementioned active ester compound obtained by aryl-esterification of phenolic hydroxyl groups in a phenol novolac resin decreases the crosslinking density of the cured product due to introduction of aryl ester structures and the cured product does not have sufficient heat resistance. As such, it has been difficult to achieve both low dielectric constant and low loss tangent.

Materials used in this field need to address environmental issues such as dioxin-related issues and there is increasing demand for halogen-free flame-retarding systems in which a flame-retarding effect is imparted to the resins without using an additive-type halogen-based flame retardant. However, the aforementioned active ester compound obtained by aryl-esterification of phenolic hydroxyl groups in a phenol novolac resin contains many easily combustible pendant-type aromatic hydrocarbon groups in its molecular structure despite the improved dielectric properties, and thus the cured product of this compound has low flame retardancy. The halogen-free flame-retarding system cannot be established with this compound.

CITATION LIST

Patent Literature

PTL 1: Japanese Unexamined Patent Application Publication No. 7-82348

SUMMARY OF INVENTION

Technical Problem

Accordingly, an object to be achieved by the present invention is to provide a thermosetting resin composition a cured product of which can exhibit good heat resistance and flame retardancy as well as low dielectric constant and low loss tangent, a cured product of the composition, an active ester resin that helps achieve these properties, a semiconductor sealing material obtained from the composition, a prepreg, a circuit board, and a build-up film.

Solution to Problem

The inventors of the present invention have conducted extensive studies to achieve the object described above and found that an active ester resin obtained by the following reactions can be cured into a cured product having good heat resistance and flame retardancy as well as low dielectric constant and low loss tangent: The active ester resin is obtained by causing all or some of hydroxyl groups of a phosphorus-containing phenolic substance to react with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid so that the hydroxyl groups form ester bonds. Thus, the present invention has been made.

In other words, the present invention relates to a method for producing an active ester resin, the method characterized by including obtaining a phosphorus-containing phenolic substance (A1) by reacting a phenolic substance (a3) with a phosphorus-containing compound (i) obtained by a reaction between an aromatic aldehyde (a1) having an alkoxy group as a substituent on an aromatic nucleus and an organic phosphorus compound (a2) having a P—H group or a P—OH group in a molecular structure; and then causing the resulting phosphorus-containing phenolic substance (A1) to react with aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phenolic substance (A1) form ester bonds.

The present invention also relates to a novel active ester resin obtained by the production method described above.

The present invention also relates to a novel active ester resin characterized by having a resin structure obtained by reacting a phenolic compound (A1x) having a structural segment (i) represented by structural formula (I) below:

[Chem. 1]

[In structural formula (I) above, Ar represents a benzene ring or a naphthalene ring, Fc represents a hydrogen atom or a hydroxyl group, and Z represents a structural segment selected from the group consisting of partial structures represented by structural formulae z1 to z4 below:

[Chem. 2]

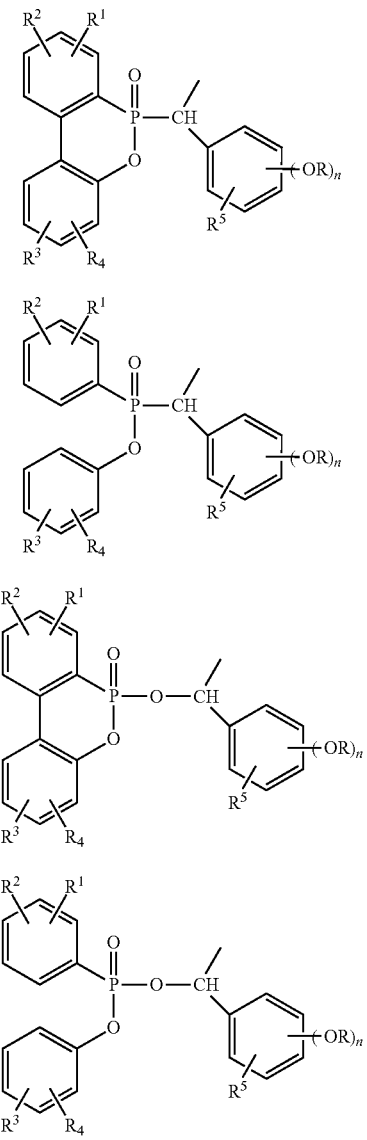

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.)]
with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that hydroxyl groups in the structural segment (i) form ester bonds, the resin structure having two structural segments (i) bonded to each other via an ester residue of the (A2).

The present invention also relates to a novel active ester resin characterized by having a resin structure obtained by reacting a phenolic resin (A1y) having a novolac-type phenolic resin structure and having, as a substituent on the aromatic nucleus, a structural segment selected from the group consisting of partial structures represented by structural formulae z1 to z4 below:

[Chem. 3]

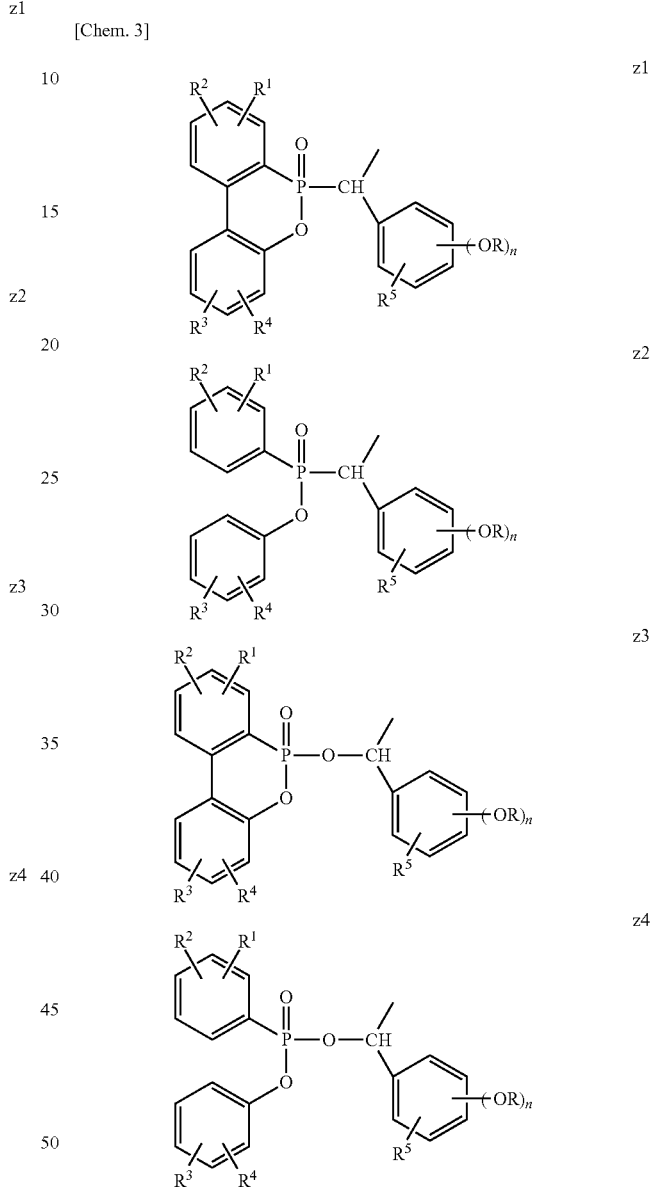

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.)
with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phenolic resin (A1y) form ester bonds, the resin structure having two hydroxyl groups bonded to each other via an ester residue of the (A2).

The present invention also relates to a novel active ester resin characterized by having a resin structure obtained by reacting a phenolic resin (A1z) having a structural segment (ii) selected from the group consisting of partial structures represented by structural formula (II) below:

[Chem. 4]

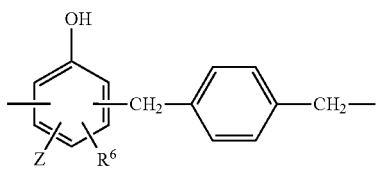
(II)

[In structural formula (II) above, $R^6$ represents a hydrogen atom or a C1-6 alkyl group, Z is selected from the group consisting of a hydrogen atom and partial structures represented by structural formulae z1 to z4 below:

[Chem. 5]

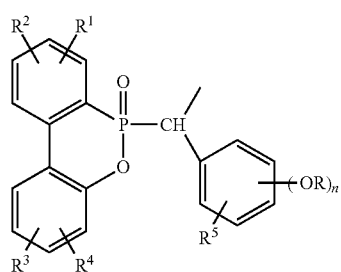
z1

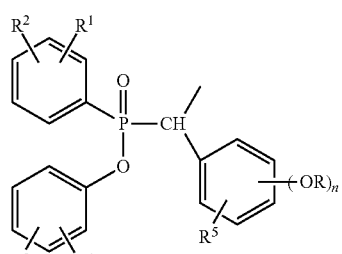
z2

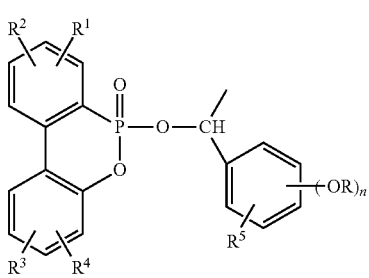
z3

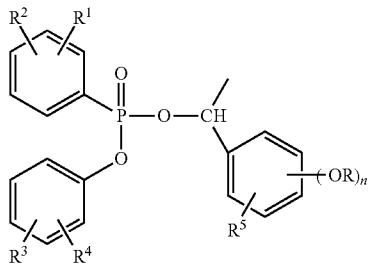
z4

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.), and at least one of Z represents a structural segment selected from the partial structures represented by structural formulae z1 to z4 above]

with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phenolic resin (A1z) form ester bonds, the resin structure having two hydroxyl groups bonded to each other via an ester residue of the (A2).

The present invention also relates to a thermosetting resin composition that contains an active ester resin (A) and an epoxy resin (B) as essential components, characterized in that the active ester resin (A) is the novel active ester resin described above.

The present invention also relates to a cured product obtained by curing the thermosetting resin composition described above.

The present invention also relates to a semiconductor sealing material containing the active ester resin (A), the epoxy resin (B), and an inorganic filler (C).

The present invention also relates to a prepreg obtained by impregnating a reinforcing substrate with a composition containing the active ester resin (A), the epoxy resin (B), and an organic solvent (D) and semi-curing the resulting impregnated substrate.

The present invention also relates to a circuit board obtained by thermally press-forming a copper foil and a plate formed by shaping a composition containing the active ester resin (A), the epoxy resin (B), and an organic solvent (D).

The present invention also relates to a build-up film characterized in that a composition containing the active ester resin (A), the epoxy resin (B), and an organic solvent (D) is applied to a base film and dried.

Advantageous Effects of Invention

According to the present invention, a thermosetting resin composition, a cured product of which can exhibit good heat resistance and flame retardancy as well as low dielectric constant and low loss tangent, a cured product thereof, an active ester resin that helps achieve these properties, a semiconductor sealing material obtained from the composition, a prepreg, a circuit board, and a build-up film can be provided.

DESCRIPTION OF EMBODIMENTS

Figure 1:
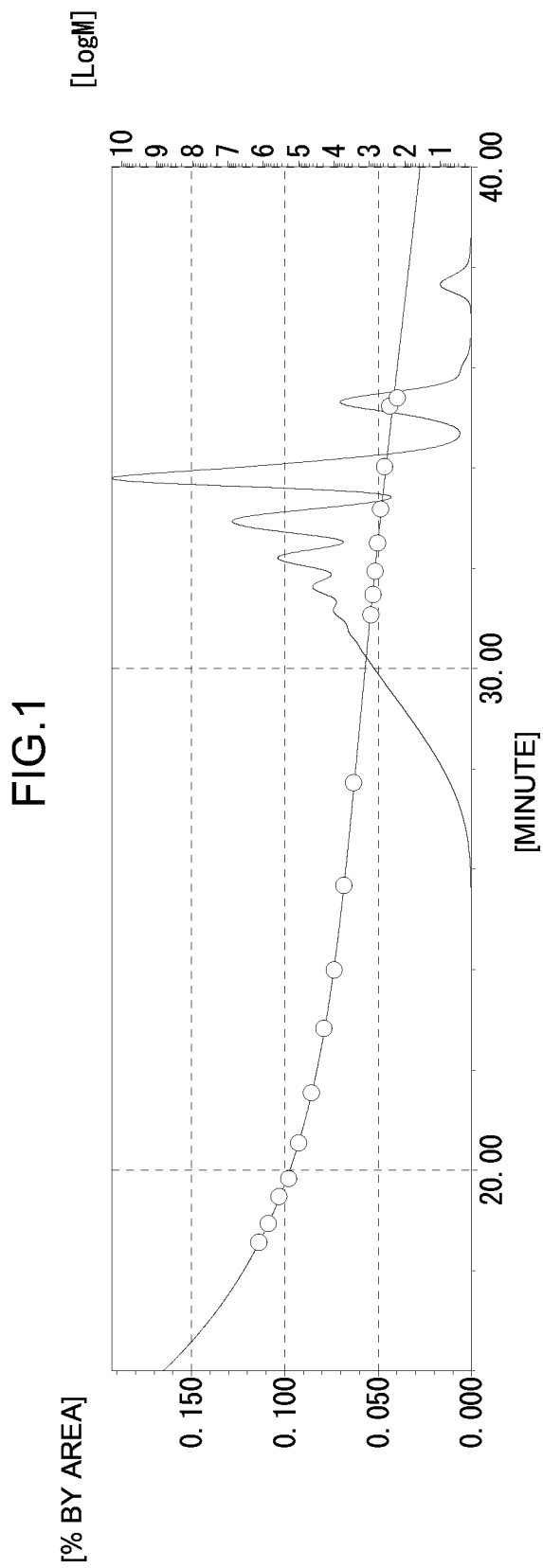
FIG. 1 is a GPC chart of a phenolic resin (A1-1) obtained in Production Example 1.

The present invention will now be described in detail.

As previously mentioned, the production method of the present invention is characterized by including obtaining a phosphorus-containing phenolic substance (A1) by reacting a phenolic substance (a3) with a phosphorus-containing compound (i) obtained by a reaction between an aromatic aldehyde (a1) having an alkoxy group as a substituent on an aromatic nucleus and an organic phosphorus compound (a2) having a P—H group or a P—OH group in a molecular structure; and causing the resulting phosphorus-containing phenolic substance (A1) to react with aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phosphorus-containing phenolic substance (A1) form ester bonds.

Since the active ester resin obtained by the production method of the present invention has a particular phosphorus-containing structure in a molecular main skeleton, a cured product exhibits good heat resistance and flame retardancy; furthermore, since the resin structure includes an aryl carbonyloxy structural segment or an alkyl carbonyloxy structural segment, the cured product can also exhibit good dielectric properties such as low dielectric constant and low loss tangent. An active ester resin having a resin structure in which phenolic hydroxyl groups of a polyfunctional phenolic hydroxyl group-containing resin are aryl carbonyl-oxylated or alkyl carbonyl-oxylated has intrinsically degraded heat resistance and flame retardancy due to the aryl carbonyloxy groups or alkyl carbonyloxy groups; however, it is notable that such degradation of heat resistance and flame retardancy rarely occurs in the present invention.

Examples of the aromatic aldehyde (a1) having an alkoxy group as a substituent on an aromatic nucleus used in the present invention include those having an alkoxy group as a substituent in the aromatic aldehyde, such as benzaldehyde, o-tolualdehyde, p-tolualdehyde, o-ethyl aldehyde, p-ethyl aldehyde, p-isopropylbenzaldehyde, naphthaldehyde, and anthracenealdehyde. Specific examples thereof include aromatic aldehydes (a1-1) represented by structural formula (a1-1) below:

[Chem. 6]

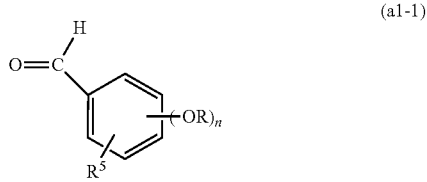

(a1-1)

(In the formula, $R^5$ represents a hydrogen atom or a C1-3 alkyl group, R represents a C1-4 alkyl group, and n represents an integer in the range of 1 to 3.) and aromatic aldehydes (a1-2) represented by structural formula (a1-2) below:

[Chem. 7]

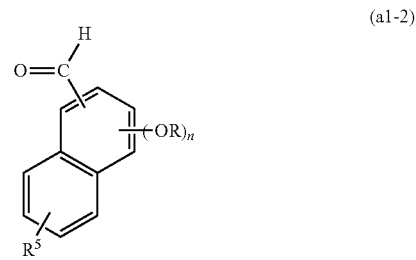

(a1-2)

(In the formula, $R^5$ represents a hydrogen atom or a C1-3 alkyl group, R represents a C1-4 alkyl group, and n represents an integer in the range of 1 to 3.)

Of these, the aromatic aldehydes (a1-1) are preferred since a phosphorus-containing compound (i) having a high phosphorus content in a molecule is obtained and an aromatic aldehyde (a1-1) in which n represents 1 is more preferable.

Since the aromatic aldehyde (a1) used in the present invention has an alkoxy group as a substituent on the aromatic nucleus, the reactivity of hydroxyl groups of the phosphorus-containing compound (i), which is the reaction product between the aromatic aldehyde (a1) and the organic phosphorus compound (a2) having a P—H group or a P—OH group. Thus, the phosphorus-containing compound (i) reacts with the aromatic nucleus in the phenolic substance (a3) practically without using a catalyst. The alkoxy group of the aromatic aldehyde (a1) is preferably a methoxy group or an ethoxy group and the aromatic aldehyde is preferably benzaldehyde or naphthaldehyde since this feature is particularly notable.

Specific examples of the organic phosphorus compound (a2), which has a P—H group or a P—OH group in the molecular structure, to be reacted with the aromatic aldehyde (a1) include compounds represented by structural formula (a2-1) or (a2-2) below:

[Chem. 8]

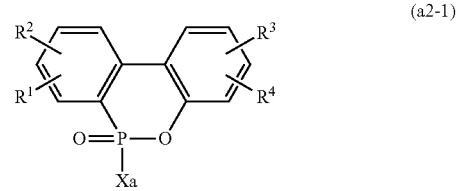

(a2-1)

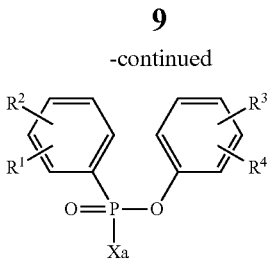
(a2-2)

[In structural formula (a2-1) or (a2-2), Xa represents a hydrogen atom or a hydroxyl group and $R^1$, $R^2$, $R^3$, and $R^4$ each independently represent a hydrogen atom, a C1-5 alkyl group, a chlorine atom, a bromine atom, a phenyl group, or an aralkyl group.]

Examples of the C1-5 alkyl group represented by $R^1$, $R^2$, $R^3$, and $R^4$ include a methyl group, an ethyl group, an n-propyl group, an i-propyl group, a t-butyl group, and an n-pentyl group.

In the present invention, an organic phosphorus compound represented by structural formula (a2-1) or (a2-2) above with Xa representing a hydrogen atom is preferred since the reactivity of the resulting phosphorus-containing compound (i) to the phenolic substance (a3) is significantly enhanced. An organic phosphorus compound represented by structural formula (a2-1) is particularly preferable since the resulting cured product of the active ester resin exhibits good flame retardancy. In particular, 9,10-dihydro-9-oxa-10-phosphaphenanthrene-10-oxide, which is a compound represented by structural formula (a2-1) with all of $R^1$, $R^2$, $R^3$, and $R^4$ representing hydrogen atoms and Xa representing a hydrogen atom is preferable since the reactivity of the resulting phosphorus-containing compound (i) to the phenolic substance (a3) and the flame retardancy and heat resistance of the final product active ester resin are significantly improved.

The reaction between the aromatic aldehyde (a1) and the organic phosphorus compound (a2) can be conducted under, for example, a temperature condition of 80° C. to 180° C. The reaction can be conducted without a catalyst. The reaction may be conducted in the presence of a non-ketone organic solvent such as an alcohol organic solvent or a hydrocarbon organic solvent.

An example of the phosphorus-containing compound (i) obtained through such a process is a compound represented by one of structural formulae x1 to x4 below if a compound represented by structural formula (a1-1) is used as the aromatic aldehyde (a1) and a compound represented by structural formula (a2-1) or (a2-2) is used as the organic phosphorus compound (a2):

[Chem. 9]

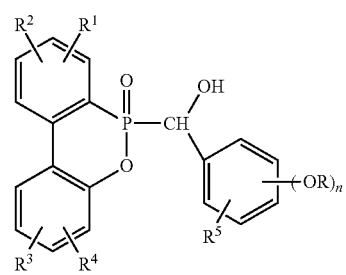
x1

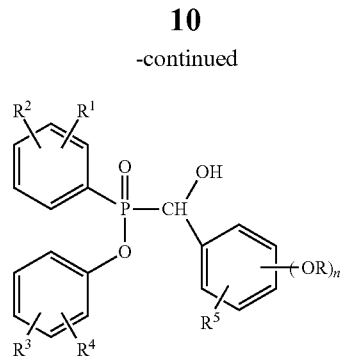
x2

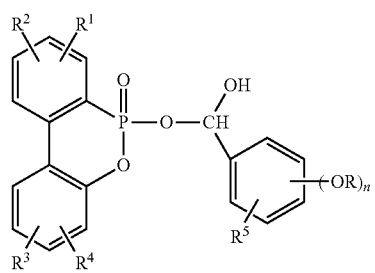
x3

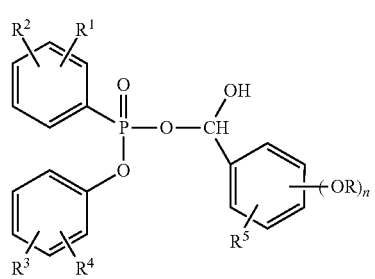
x4

(In structural formulae x1 to x4 above, R1, R2, R3, and R4 each independently represent a hydrogen atom, a C1-5 alkyl group, a chlorine atom, a bromine atom, a phenyl group, or an aralkyl group, R5 represents a hydrogen atom or a C1-5 alkyl group, R represents a C1-4 alkyl group, and n is an integer in the range of 1 to 3.)

Among these, compounds represented by structural formulae x1 and x2 are preferable since they have high reactivity to the phenolic substance (a3). In particular, a compound represented by structural formula x1 above is preferable since the final product active ester resin exhibits good flame retardancy.

Next, examples of the phenolic substance (a3) used in the present invention include monovalent phenols such as phenol, cresol, xylenol, ethyl phenol, isopropyl phenol, t-butylphenol, octyl phenol, nonyl phenol, vinyl phenol, isopropenyl phenol, allyl phenol, phenyl phenol, benzyl phenol, chlorophenol, bromophenol, and naphthol; dihydric phenols such as catechol, resorcinol, hydroquinone, 1,5-dihydroxynaphthalene, 1,6-dihydroxynaphthalene, and 2,7-dihydroxynaphthalene; bisphenols such as bisphenol A, bisphenol F, and bisphenol S; novolac-type phenolic resins such as phenol novolac resins, cresol novolac resins, bisphenol A novolacresins, bisphenol S novolac resins, α-naphthol novolac resins, β-naphthol novolac resins, dihydroxynaphthalene novolac resins, and other novolac resins represented by structural formula (A3-a) below

[Chem. 10]

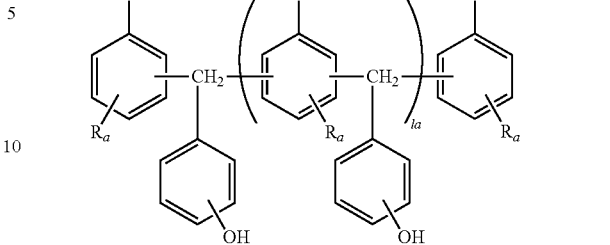

(In the formula, Ra represents a hydrogen atom or a C1-6 hydrocarbon group and 1a represents the number of repeating units and is an integer in the range of 0 to 10.);
phenolic resins having a molecular structure in which phenols are bonded to each other via an alicyclic hydrocarbon group selected from the group consisting of dicyclopentadiene, tetrahydroindene, 4-vinylcyclohexene, 5-vinylnorborn-2-ene, α-pinene, β-pinene, and limonene; aralkyl-type phenolic resins represented by structural formula (A3-b) below:

[Chem. 11]

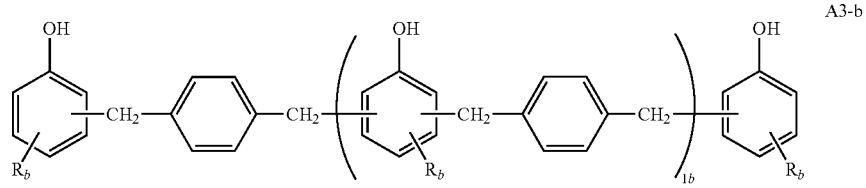

(In the formula, Rb represents a hydrogen atom or a C1-6 hydrocarbon group and 1b represents the number of repeating units and is an integer in the range of 0 to 10.); aralkyl-type phenolic resins represented by structural formula (A3-c) below:

[Chem. 12]

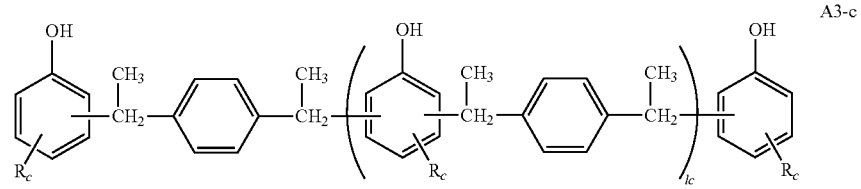

(In the formula, Rc represents a hydrogen atom or a C1-6 hydrocarbon group and 1c represents the number of repeating units and is an integer in the range of 0 to 10.); aralkyl-type phenolic resins represented by structural formula (A3-d) below:

[Chem. 13]

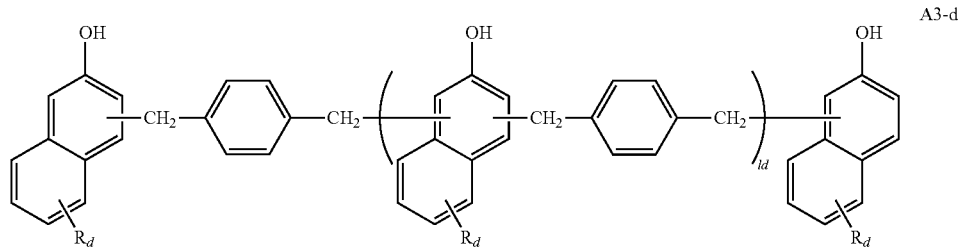

(In the formula, Rd represents a hydrogen atom or a C1-6 hydrocarbon group and 1d represents the number of repeating units and is an integer in the range of 0 to 10.); aralkyl-type phenolic resins represented by structural formula (A3-e) below:

[Chem. 14]

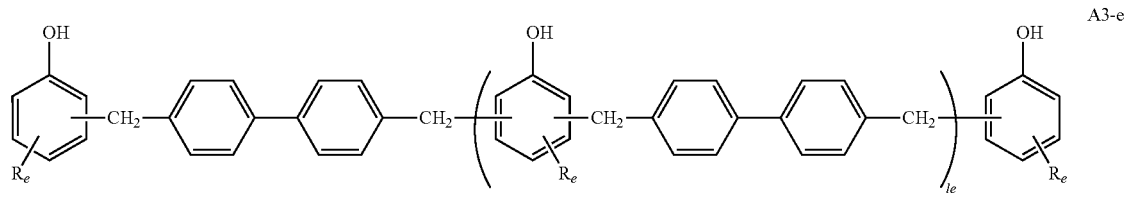

(In the formula, Re represents a hydrogen atom or a C1-6 hydrocarbon group and 1e represents the number of repeating units and is an integer in the range of 0 to 10.); aralkyl-type phenolic resins represented by structural formula (A3-f) below:

[Chem. 15]

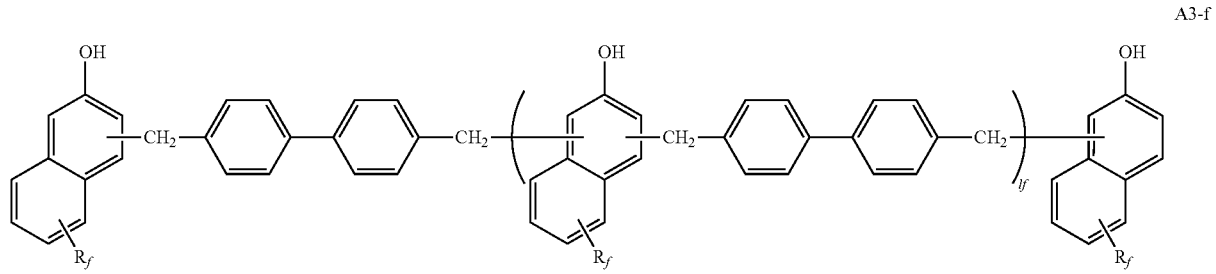

(In the formula, Re represents a hydrogen atom or a C1-6 hydrocarbon group and 1f represents the number of repeating units and is an integer in the range of 0 to 10.); aralkyl-type phenolic resins such as compounds represented by structural formula (A3-g) below:

[Chem. 16]

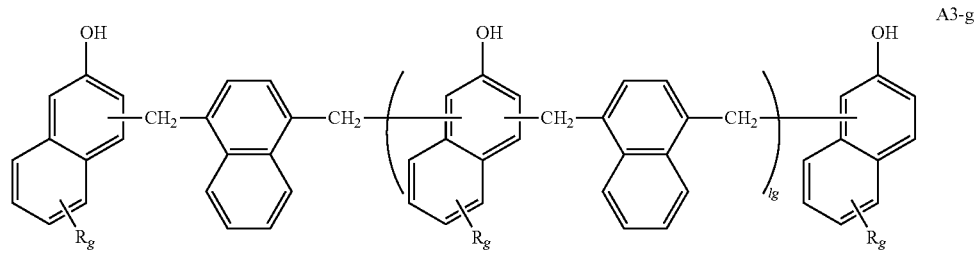

A3-g (In the formula, R9 represents a hydrogen atom or a C1-6 hydrocarbon group and 1 g represents the number of repeating units and is an integer in the range of 0 to 10.); biphenols represented by structural formula (A3-h) below:

[Chem. 17]

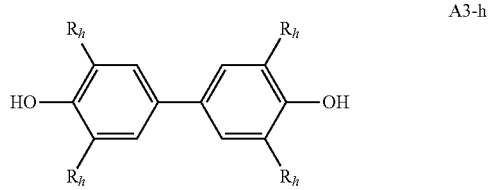

A3-h (In the formula, Rh each independently represent a hydrogen atom or a C1-4 alkyl group.);
polyvalent naphthol represented by structural formula A3-i below:

[Chem. 18]

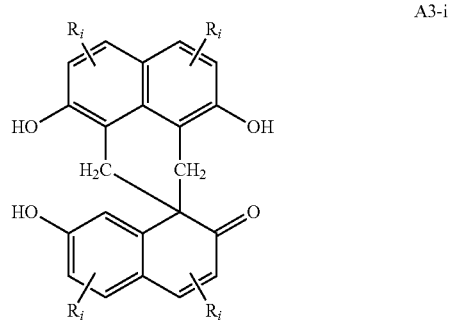

A3-i (In the formula, Ri each independently represent a hydrogen atom or a C1-4 alkyl group.); and
when structural units, namely, a phenolic hydroxyl group-containing aromatic hydrocarbon group (Ph), an alkoxy group-containing fused polycyclic aromatic hydrocarbon group (An), and a divalent hydrocarbon group (M) selected from a methylene group, an alkylidene group, and an aromatic hydrocarbon structure-containing methylene group (hereinafter this is simply referred to as "methylene group or the like (M)", are respectively denoted by "Ph", "An", and "M", polyfunctional phenols having a structural segment represented by partial structure formula (A3-j) below:

[Chem. 19]

-Ph-M-An-      A3-j in which this structural segment is contained in the molecular structure.

Specific examples of the polyfunctional phenol containing a structural segment represented by partial structure formula A3-j in the molecular structure include alternating copolymer structures containing structures represented by structural formulae (A3-j2) and (A3-j3) below:

[Chem. 20]

Ph-M-An-M-Ph      A3-j2

An-M-Ph-M-Ph-M-An      A3-j3 alternating copolymer structures containing a structure that includes a novolac structure having a repeating unit represented by structural formula (A3-j4) or (A3-j5) below:

[Chem. 21]

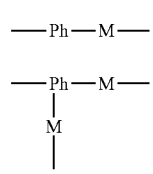

in which a molecular terminal of the novolac structure has a structure represented by structural formula (A3-j6) below:

[Chem. 22]

An-M-      A3-j6; and alternating copolymers containing other structures represented by structural formulae (A3-j7) to (A3-j10) below:

[Chem. 23]

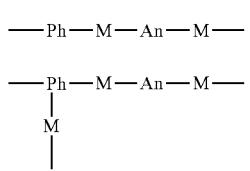

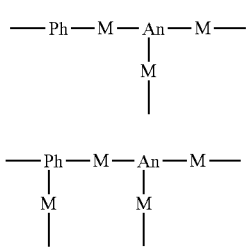

A3-j9

A3-j10 in which these structures are contained as the repeating units.

Here, the phenolic hydroxyl group-containing aromatic hydrocarbon group (Ph) may take a variety of structures. To be specific, phenols, naphthols, and compounds having alkyl groups as the substituents of these aromatic nuclei such as those represented by structural formulae Ph1 to Ph16 below are preferable from the viewpoint of good dielectric performance.

[Chem. 24]

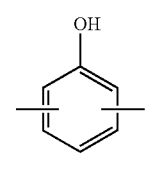
Ph1

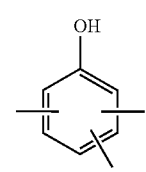
Ph2

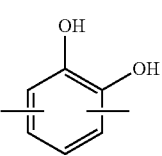
Ph3

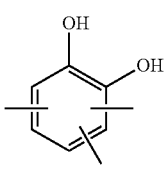
Ph4

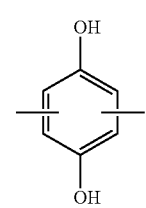
Ph5

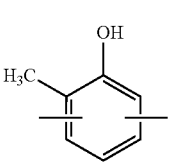
Ph6

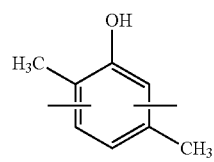
Ph7

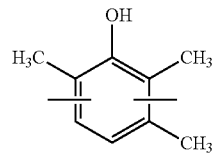
Ph8

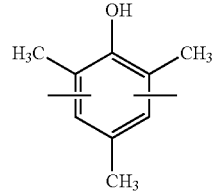
Ph9

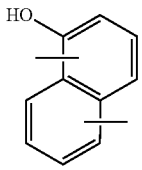
Ph10

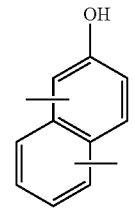
Ph11

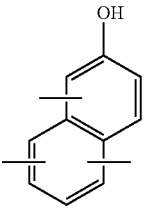
Ph12

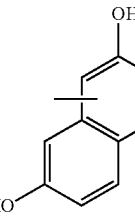
Ph13

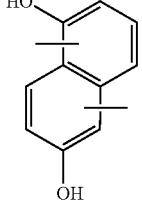
Ph14

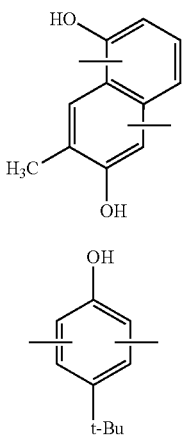
Ph15

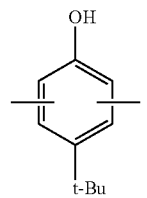
Ph16

Regarding these structures, when the structure is located at the molecular terminal, a monovalent aromatic hydrocarbon group is formed. Among the above-described structures, those which have two or more bonding sites that bond to other structural segments and lie on the naphthalene skeleton may have these bonding sites on the same nucleus or different nuclei.

Next, the alkoxy group-containing fused polycyclic aromatic hydrocarbon group (An) contained in the phenolic resin structure is a monovalent or higher valent aromatic hydrocarbon group having an alkoxy group as a substituent on the fused polycyclic aromatic nucleus. Specific examples thereof include alkoxynaphthalene-type structures represented by structural formulae An1 to An12 below:

[Chem. 25]

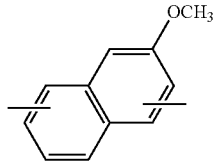
An1

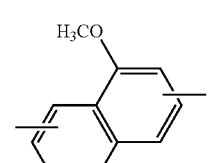
An2

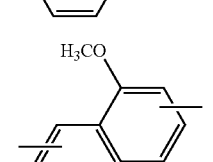
An3

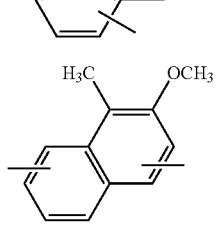
An4

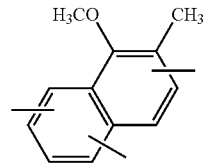
An5

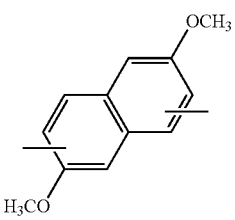
An6

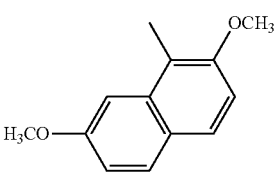
An7

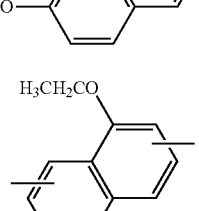
An8

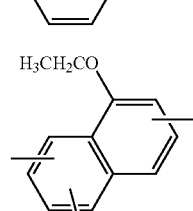
An9

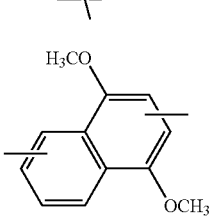
An10

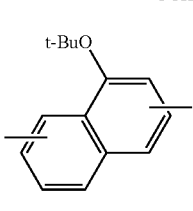
An11

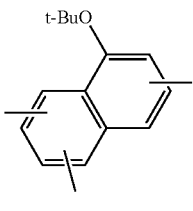
An12

Regarding these structures, when the structure is located at the molecular terminal, a monovalent aromatic hydrocarbon group is formed. Among the above-described structures, those which have two or more bonding sites that bond to other structural segments and lie on the naphthalene skeleton may have these bonding sites on the same nucleus or different nuclei.

Examples of the divalent hydrocarbon group (M) selected from a methylene group, an alkylidene group, and an aromatic hydrocarbon structure-containing methylene group include a methylene group and alkylidene groups such as an ethylidene group, a 1,1-propylidene group, a 2,2-propylidene group, a dimethylene group, a propane-1,1,3,3-tetrayl group, an n-butane-1,1,4,4-tetrayl group, and an n-pentane-1,1,5,5-tetrayl group. Examples of the aromatic hydrocarbon structure-containing methylene group include those having structures represented by M1 to M8 below:

[Chem. 26]

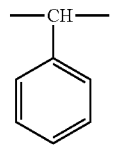

M1

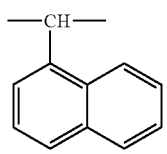

M2

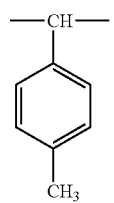

M3

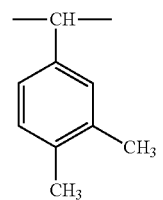

M4

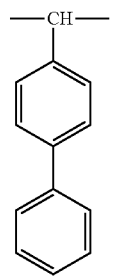

M5

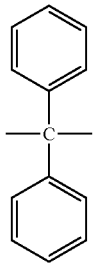

M6

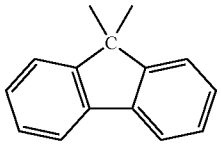

M7

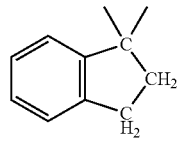

M8

Among these, a methylene group is preferable since the dielectric effect is particularly excellent.

In the present invention, dihydric phenols, novolac-type phenolic resins, and aralkyl-type phenolic resins are particularly preferable among these because the curability and the organic solvent solubility of the resulting active ester resin used as an epoxy resin curing agent are improved. In particular, in the case where the final product active ester resin is used as an epoxy resin curing agent for an epoxy resin composition for printed wiring boards, novolac-type phenolic resins and aralkyl-type phenolic resins are preferable due to their good solvent solubility and good moisture resistance and flame retardancy. In this case, novolac-type phenolic resins preferably have a melt viscosity in the range of 0.5 to 300 dPa·s at 150° C. from the viewpoints of moisture resistance, heat resistance, and heat resistance reliability. The melt viscosity of the aralkyl phenolic resins at 150° C. is preferably in the range of 0.1 to 300 dPa·s since a cured product of the final product active ester resin exhibits excellent moisture resistance, heat resistance, and heat resistance reliability. The dihydric phenol is preferably a dihydroxynaphthalene such as 1,5-dihydroxynaphthalene, 1,6-dihydroxynaphthalene, or 2,7-dihydroxynaphthalene since the cured product of the final product active ester resin exhibits good heat resistance.

The reaction between the phenolic substance (a3) and the phosphorus-containing compound (i) which is the reaction product between the aromatic aldehyde (a1) and the organic phosphorus compound (a2) can be conducted under, for example, a temperature condition of 140° C. to 200° C. In the present invention, the reactivity between the phosphorus-containing compound (i) and the phenolic substance (a3) is significantly high and a catalyst is not needed; however, a catalyst may be used if appropriate. Examples of the catalyst that can be used include inorganic acids such as hydrochloric acid, sulfuric acid, and phosphoric acid, organic acids such as methanesulfonic acid, p-toluenesulfonic acid, and oxalic acid, and Lewis acids such as boron trifluoride, anhydrous aluminum chloride, and zinc chloride. The amount used is preferably less than 5.0% by mass relative to the total weight of the charged raw materials.

In the present invention, the reaction ratio of the phosphorus-containing compound (i) to the phenolic substance (a3) is not particularly limited. Rather, because the reactivity is high, the amount of modification of the phosphorus-containing compound (i) relative to the phenolic substance (a3) can be freely controlled depending on the usage or the target performance levels of flame retardancy and heat resistance. Preferably, the reaction is performed at a ratio at which the phosphorus-containing compound (i) does not remain in the reaction product, namely, at a ratio equal to or less than the equivalent relative to the reaction points on the aromatic nucleus of the phenolic substance (a3). In the case where a novolac-type phenolic resin or an aralkyl-type phenolic resin, which is preferred the phenolic substance (a3), is to be modified with the phosphorus-containing compound (i), the phosphorus content is preferably in the range of 4.0% to 7.0% by mass on a mass basis to achieve good heat resistance and flame retardancy.

After the reaction, dehydration and drying may be conducted as needed to obtain a target product. The phosphorus-containing phenolic substance (A1) obtained as such is substantially free of the phosphorus-containing compound (i) as an unreacted component. For example, in the case where a novolac-type phenolic resin or an aralkyl-type phenolic resin is modified with the phosphorus-containing compound (i) and where the phosphorus content is controlled to be in the range of 4.0% to 7.0% by mass on a mass basis, the amount of the phosphorus-containing compound (i) remaining is below the GPC detection level in the phosphorus-containing phenolic compound.

The molecular structure of the phosphorus-containing phenolic substance (A1) obtained as such can be freely designed by choosing the raw material components described above. Specific examples thereof include a phenolic compound (A1x) having a structural segment (i) represented by structural formula (I) below:

[Chem. 27]

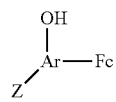

(I)

[In structural formula (I), Ar represents a benzene ring or a naphthalene ring, Fc represents a hydrogen atom or a hydroxyl group, and Z represents a structural segment selected from the group consisting of partial structures represented by structural formulae z1 to z4 below:

[Chem. 28]

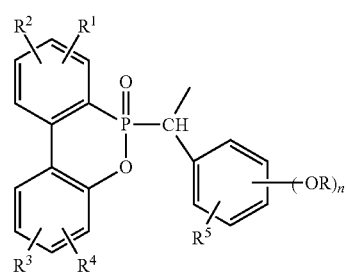

z1

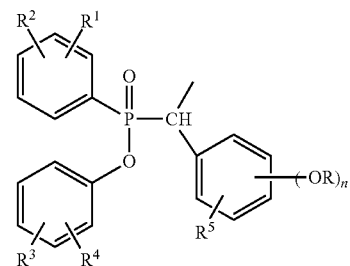

z2

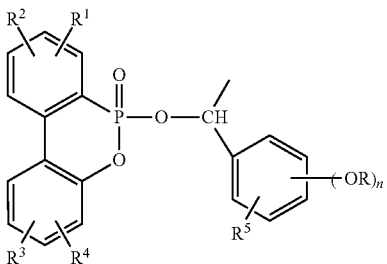

z3

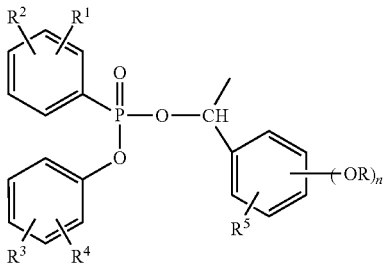

z4

(In structural formulae z1 to z4, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.)];

a phenolic resin (A1y) having a novolac-type phenolic resin structure and having, as a substituent on the aromatic nucleus, a structural segment selected from the group consisting of partial structures represented by structural formulae z1 to z4 below:

[Chem. 29]

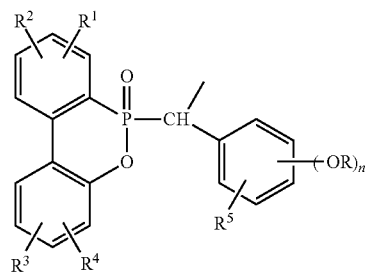

z1

-continued

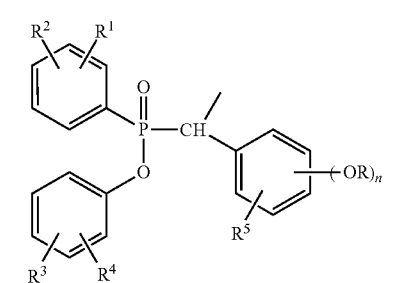
z2

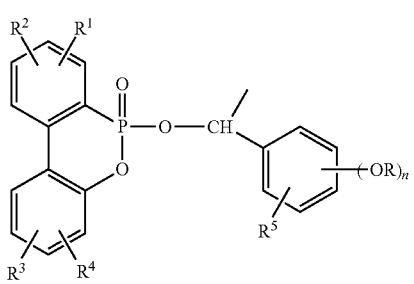
z3

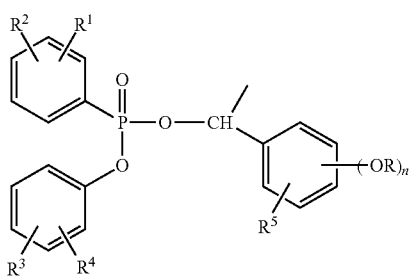
z4

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.); and a phenolic resin (A1z) having a structural segment (ii) selected from the group consisting of partial structures represented by structural formula (II) below:

[Chem. 30]

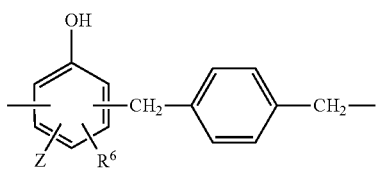
(II)

[In structural formula (II) above, $R^6$ represents a hydrogen atom or a C1-6 alkyl group, Z is selected from the group consisting of a hydrogen atom and partial structures represented by structural formulae z1 to z4 below:

[Chem. 31]

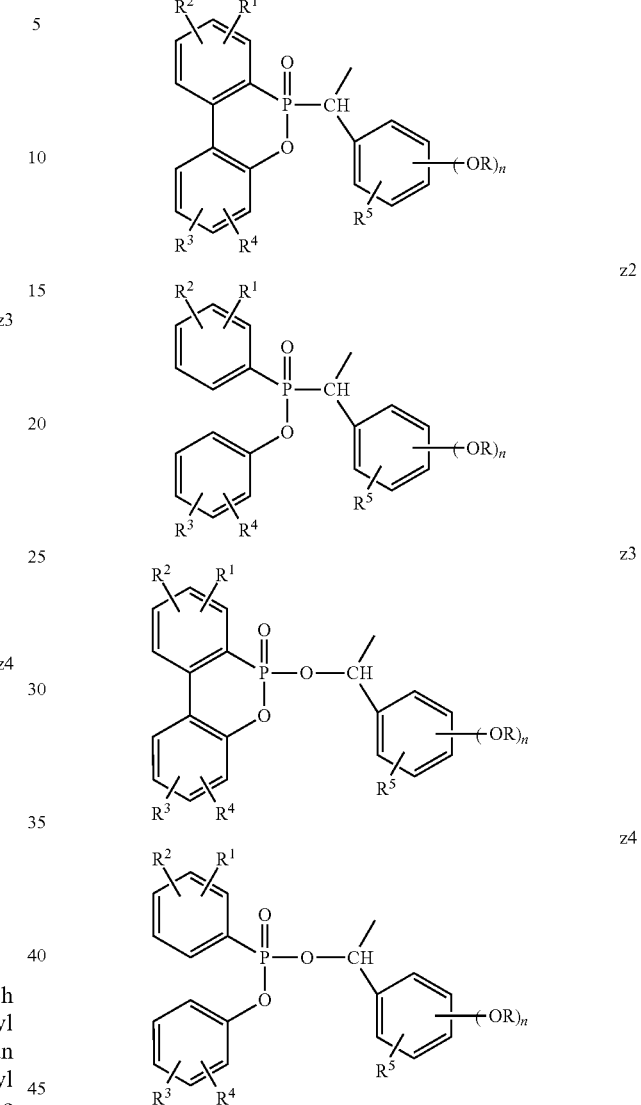

(In structural formula z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.), and at least one of Z is selected from the partial structures represented by structural formulae z1 to z4 above].

In the phenolic compound (A1x) or the phenolic resin (A1y) or (A1z), partial structures represented by structural formulae z1 and z2 are preferable among the partial structures represented by structural formulae z1 to z4, since a cured product having particularly high heat resistance can be obtained. A partial structure represented by structural formula z1 is particularly preferable.

Next, an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) to be reacted with the phosphorus-containing phenolic substance (A1) is discussed. Examples of an aromatic dicarboxylic acid or an anhydride or dihalide of an aromatic dicarboxylic acid used as (A2) include aromatic dicarboxylic acids such as phthalic acid, isophthalic acid, terephthalic acid, 2,6-naphthalenedicarboxylic acid, 1,6-naphthalenedicarboxylic acid, and 2,7-naphthalenedicarboxylic acid, anhydrides of phthalic acid, and acid halides such as acid fluorides, acid chloride, acid bromides, and acid iodides of the aromatic dicarboxylic acids.

Specific examples of a C2-6 saturated dicarboxylic acid or an anhydride or dihalide of a C2-6 saturated dicarboxylic acid include saturated dicarboxylic acids such as oxalic acid, malonic acid, succinic acid, glutaric acid, and adipic acid, anhydrides of these saturated dicarboxylic acids, and acid halides, such as acid fluorides, acid chlorides, acid bromides, and acid iodides, of these saturated dicarboxylic acids.

These aromatic dicarboxylic acids or anhydrides and dihalides of the aromatic dicarboxylic acids or C2-6 saturated dicarboxylic acids or anhydrides and dihalides of C2-6 saturated dicarboxylic acids (A2) may be used alone or in combination of two or more. Among these, an aromatic dicarboxylic acid or an anhydride or dihalide of an aromatic dicarboxylic acid is more preferable since an active ester resin having higher heat resistance and flame retardancy as well as good dielectric properties such as low dielectric constant and low loss tangent is obtained. Isophthalic acid chloride and terephthalic acid chloride are particularly preferable since the reactivity to phenolic hydroxyl groups in the phosphorus-containing phenolic substance (A1) is improved.

A specific example of the method for carrying out the reaction between the phosphorus-containing phenolic substance (A1) and an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) is a method of causing an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) to react with a phosphorus-containing phenolic substance (A1) in the presence of a basic catalyst. The reaction ratio for the phosphorus-containing phenolic substance (A1) and an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) is preferably a ratio at which the equivalent ratio of the phenolic hydroxyl groups in (A1) to the carboxyl groups in (A2), namely, [OH in (A1)]/carboxyl groups (or halide) in (A2)], is 1.00/0.01 to 1.00/0.40 since the resulting active ester resin exhibits high solvent solubility. In particular, the ratio [OH in (A1)]/carboxyl groups (or halide) in (A2)] is 1.00/0.05 to 1.00/0.35 since a cured coating film of the active ester resin obtained exhibits higher heat resistance and flame retardancy.

Examples of the alkaline catalyst that can be used in the aforementioned method include sodium hydroxide, potassium hydroxide, triethylamine, and pyridine. Among these, sodium hydroxide and potassium hydroxide are particularly preferable since they can be used in the form of aqueous solutions and the productivity can be improved.

In the reaction by the method described above, the respective raw material components are preferably dissolved in organic solvents and used in the reaction. Examples of the organic solvents that can be used include toluene and dichloromethane.

The molecular structure of the active ester resin obtained as such can be freely designed by selecting the respective raw material components. Specific examples thereof include a novel active ester resin (Ax-1) characterized by having a resin structure obtained by reacting a phenolic compound (A1x) having a structural segment (i) represented by structural formula (I) below:

[Chem. 32]

[In structural formula (I), Ar represents a benzene ring or a naphthalene ring, Fc represents a hydrogen atom or a hydroxyl group, and Z represents a structural segment selected from the group consisting of partial structures represented by structural formula z1 to z4 below:

[Chem. 33]

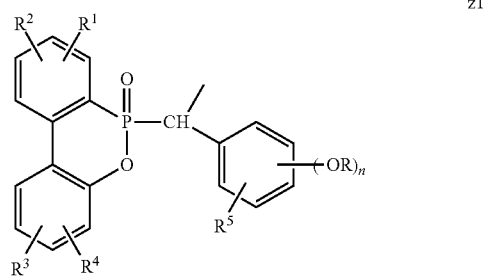

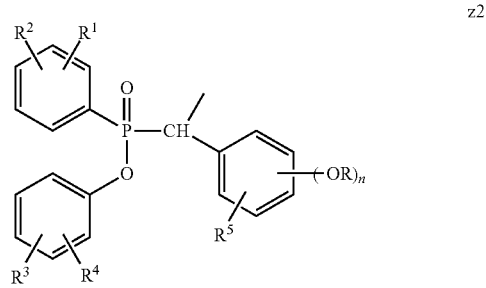

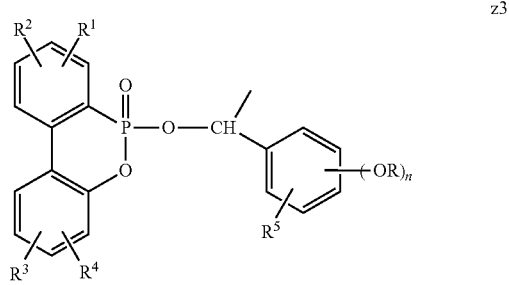

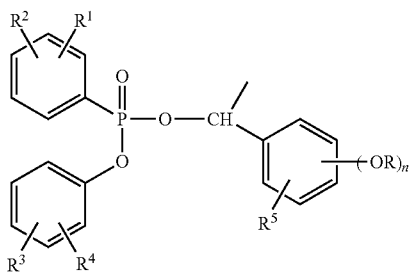

z4

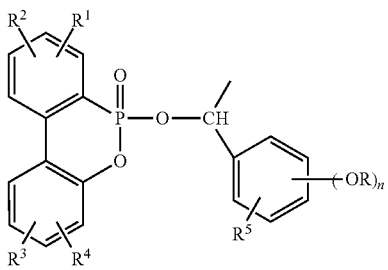

z3

(In structural formula z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.]

with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that hydroxyl groups in the phosphorus-containing compound (i) form ester bonds, the resin structure having two structural segments (i) bonded to each other via an ester residue of the (A2);

a novel active ester resin (Ay-1) characterized by having a resin structure obtained by reacting a phenolic resin (A1y) having a novolac-type phenolic resin structure and having, as a substituent on the aromatic nucleus, a structural segment selected from the group consisting of partial structures represented by structural formulae z1 to z4 below:

[Chem. 34]

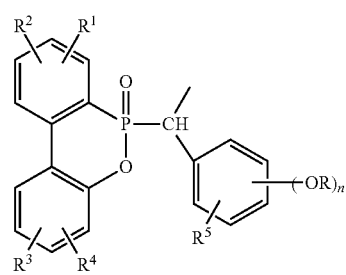

z1

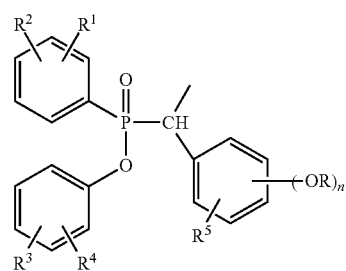

z2

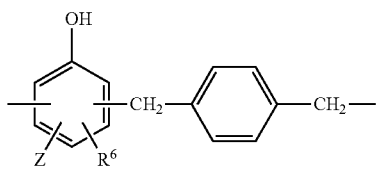

z4

(In structural formula z1 to z4 above, $R^1$, $R^2$, $R^3$, and $R^4$ each independently represents a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.)

with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phenolic resin (A1y) form ester bonds, the resin structure having two hydroxyl groups bonded to each other via an ester residue of the (A2); and a novel active ester resin (Az-1) characterized by having a resin structure obtained by reacting a phosphorus-containing phenolic resin (A1z) having a structural segment (ii) selected from the group consisting of partial structures represented by structural formula (II) below:

[Chem. 35]

$$\text{OH} \quad \text{structure with } CH_2\text{—}\bigcirc\text{—}CH_2\text{—, Z, } R^6$$

(II)

[In structural formula (II) above, $R^6$ represents a hydrogen atom or a C1-6 alkyl group and Z represents a structural segment selected from the group consisting of a hydrogen atom and partial structures represented by structural formulae z1 to z4 below:

[Chem. 36]

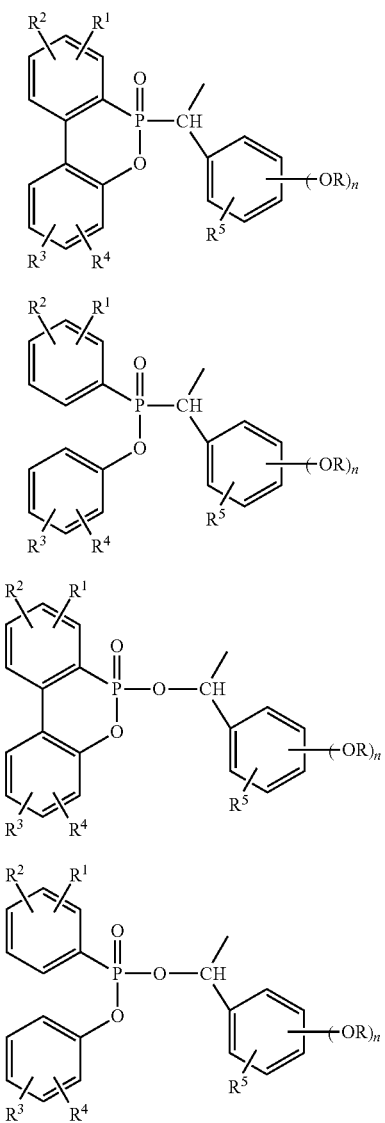

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3), and
at least one of Z represents a structural segment selected from the partial structures represented by structural formulae z1 to z4]
with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phenolic resin (A1z) form ester bonds, the resin structure having two hydroxyl groups bonded to each other via an ester residue of the (A2).

In the active ester resin (Ax-1), (Ay-1), or (Az-1), partial structures represented by structural formulae z1 and z2 are preferable among the partial structures represented by structural formulae z1 to z4 since a cured product having particularly high heat resistance is obtained. A partial structure represented by structural formula z1 is particularly preferable.

In the active ester resin (Ay-1) or (Az-1), the ratio of phenolic hydroxyl groups that form ester bonds among all phenolic hydroxyl groups is preferably in the range of 1% to 40% by mol since the resulting active ester resin exhibits high glass transition temperature. In particular, the ratio is preferably in the range of 5% to 35% by mol since the heat resistance and flame retardancy of a cured coating film of the active ester resin obtained are further enhanced.

In the production method of the present invention, in order to obtain an active ester resin having higher heat resistance and flame retardancy as well as good dielectric properties such as low dielectric constant and low loss tangent, some of hydroxyl groups of the phosphorus-containing phenolic substance (A1) are preferably reacted with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so as to form ester bonds and all or some of the rest of hydroxyl groups of the phosphorus-containing phenolic substance (A1) are preferably reacted with an aromatic monocarboxylic acid or a halide thereof or a C2-6 saturated aliphatic acid or a halide or anhydride thereof (A3) so as to form ester bonds.

Regarding an aromatic monocarboxylic acid or a halide thereof or a C2-6 saturated aliphatic acid or a halide or anhydride thereof (A3) used here, specific examples of the aromatic monocarboxylic acid or a halide thereof include benzoic acids; alkyl benzoic acids such as phenyl benzoic acid, methyl benzoic acid, ethyl benzoic acid, n-propyl benzoic acid, i-propyl benzoic acid, and t-butyl benzoic acid; alkyl naphthoic acids such as 1-naphthoic acid, 2-naphthoic acid, phenyl naphthoic acid, methyl naphthoic acid, ethyl naphthoic acid, n-propyl naphthoic acid, i-propyl naphthoic acid, and t-butyl naphthoic acid; and acid halides, such as acid fluorides, acid chlorides, acid bromides, and acid iodides, of these acids.

Specific examples of the C2-6 saturated aliphatic acids and halides and anhydrides thereof include acetic acid, propionic acid, butyric acid, pentanoic acid, hexanoic acid; acid halides, such as acid fluorides, acid chlorides, acid bromides, and acid iodides, of these acid; and acid anhydrides such as anhydrides of acetic acid, propionic acid, butyric acid, pentanoic acid, and hexanoic acid.

These aromatic monocarboxylic acids or halides thereof or C2-6 saturated aliphatic acids or halides or anhydrides thereof (A3) may be used alone or in combination of two or more. Among these, aromatic monocarboxylic acids and halides thereof are preferable since an active ester resin having higher heat resistance and flame retardancy as well as good dielectric properties such as low dielectric constant and low loss tangent is obtained. A benzoic acid chloride or an alkyl benzoic acid base is particularly preferable since the reactivity to phenolic hydroxyl groups in the phosphorus-containing phenolic substance (A1) is enhanced.

Examples of the method for reacting the phosphorus-containing phenolic substance (A1), an aromatic monocarboxylic acid or a halide thereof or a C2-6 saturated aliphatic acid or a halide or anhydride thereof (A3), and an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) include a method (hereinafter simply referred to as "method 1") in which the phosphorus-containing phenolic substance (A1), an aromatic monocarboxylic acid or a halide thereof or a C2-6 saturated aliphatic acid or a halide or anhydride thereof (A3), and an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) are reacted in one step;

a method (hereinafter simply referred to as "method 2") in which the phosphorus-containing phenolic substance (A1) is reacted with an aromatic monocarboxylic acid or a halide thereof or a C2-6 saturated aliphatic acid or a halide or anhydride thereof (A3) and then with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2); and a method (hereinafter simply referred to as "method 3") in which the phosphorus-containing phenolic substance (A1) is reacted with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) and then with an aromatic monocarboxylic acid or a halide thereof or a C2-6 saturated aliphatic acid or a halide or anhydride thereof (A3).

The method 1 will now be described. A specific example of the method 1 includes reacting a phosphorus-containing phenolic substance (A1), an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2), and an aromatic monocarboxylic acid or a halide thereof or a C2-6 saturated aliphatic acid or a halide or anhydride thereof (A3) in the presence of a basic catalyst.

In the method 1, the ratio of the respective reactive components, namely the equivalent ratio [OH/carboxyl groups (or halide)] of a total of carboxyl groups or halide thereof in an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) and carboxyl groups or halide thereof in an aromatic monocarboxylic acid or a halide thereof or a C2-6 saturated aliphatic acid or a halide or anhydride thereof (A3) relative to hydroxyl groups in the phosphorus-containing phenolic substance (A1) is preferably in the range of 1.0/0.5 to 1.0/1.0 since the resulting active ester resin exhibits high heat resistance and flame retardancy. Furthermore, the range is more preferably 1.0/0.7 to 1.0/1.0 and yet more preferably 1.0/0.8 to 1.0/1.0 to further decrease the dielectric constant and loss tangent of a cured coating film of the resulting active ester resin.

In the method 1, as for the ratio of an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) to an aromatic monocarboxylic acid or a halide thereof or a C2-6 saturated aliphatic acid or a halide or anhydride thereof (A3), the equivalent ratio [(A2)/(A3)] of carboxyl groups or halide thereof in an aromatic monocarboxylic acid or a halide thereof or a C2-6 saturated aliphatic acid or a halide or anhydride thereof (A3) relative to carboxyl groups or halide thereof in an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) is preferably in the range of 0.99/0.01 to 0.60/0.40 since heat resistance is enhanced.

The equivalent ratio [(A2)/(A3)] of carboxyl groups or halide thereof in an aromatic monocarboxylic acid or a halide thereof or a C2-6 saturated aliphatic acid or a halide or anhydride thereof (A3) relative to carboxyl groups or halide thereof in an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) is more preferably in the range of 0.95/0.05 to 0.65/0.35 since the dielectric constant and the loss tangent are further decreased.

The method 2 will now be described. A specific example of the method 2 includes reacting a phosphorus-containing phenolic substance (A1) with an aromatic monocarboxylic acid or a halide thereof or a C2-6 saturated aliphatic acid or a halide or anhydride thereof (A3) in the presence of a basic catalyst and then reacting the resulting intermediate with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) in the presence of a basic catalyst.

The method 3 will now be described. A specific example of the method 2 includes reacting a phosphorus-containing phenolic substance (A1) with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) in the presence of a basic catalyst and then reacting the resulting intermediate with an aromatic monocarboxylic acid or a halide thereof or a C2-6 saturated aliphatic acid or a halide or anhydride thereof (A3) in the presence of a basic catalyst.

In the methods 2 and 3, the ratio of the respective reactive components, namely, the equivalent ratio [OH/carboxyl groups (or halides)] of a total of carboxyl groups or halide thereof in an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) and carboxyl groups or halide thereof in an aromatic monocarboxylic acid or a halide thereof or a C2-6 saturated aliphatic acid or a halide or anhydride thereof (A3) relative to hydroxyl groups in the phosphorus-containing phenolic substance (A1) is preferably in the range of 1.0/0.5 to 1.0/1.0 since the resulting active ester resin exhibits higher heat resistance and flame retardancy. Furthermore, the range is more preferably 1.0/0.7 to 1.0/1.0 and yet more preferably 1.0/0.8 to 1.0/1.0 since a cured coating film of the resulting active ester resin exhibits lower dielectric constant and loss tangent.

In the methods 2 and 3, as for the ratio of an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) to an aromatic monocarboxylic acid or a halide thereof or a C2-6 saturated aliphatic acid or a halide or anhydride thereof (A3), the equivalent ratio [(A2)/(A3)] of carboxyl groups or halide thereof in an aromatic monocarboxylic acid or a halide thereof or a C2-6 saturated aliphatic acid or a halide or anhydride thereof (A3) relative to carboxyl groups or halide thereof in an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) is preferably in the range of 0.99/0.01 to 0.60/0.40 since heat resistance is enhanced.

The equivalent ratio [(A2)/(A3)] of carboxyl groups or halide thereof in an aromatic monocarboxylic acid or a halide thereof or a C2-6 saturated aliphatic acid or a halide or anhydride thereof (A3) relative to carboxyl groups or halide thereof in an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) is more preferably in the range of 0.95/0.05 to 0.65/0.35 since the dielectric constant and the loss tangent are further decreased.

Examples of the alkaline catalyst that can be used in the methods 1 to 3 include sodium hydroxide, potassium hydroxide, triethylamine, and pyridine. Among these, sodium hydroxide and potassium hydroxide are particularly preferable since they can be used in the form of aqueous solutions and the productivity can be improved.

In the reactions by the methods 1 to 3 described above, the respective raw material components are preferably dissolved in organic solvents and used in the reaction. Examples of the organic solvents that can be used include toluene, methyl isobutyl ketone, and dichloromethane.

Among the methods 1 to 3 described above, the method 1 is preferable since the production is easy.

The molecular structure of the active ester resin obtained as such can be freely designed by selecting the respective raw material components. Specific examples thereof include an active ester resin (Ax-2) having a resin structure in which one of hydroxyl groups of a phenolic compound (A1x) having a structural segment (i) represented by structural formula (I) below:

[Chem. 37]

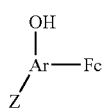
(I)

[In structural formula (I) above, Ar represents a benzene ring or a naphthalene ring, Fc represents a hydroxyl group, and z represents a structural segment selected from the group consisting of partial structures represented by structural formulae z1 to z4 below:

[Chem. 38]

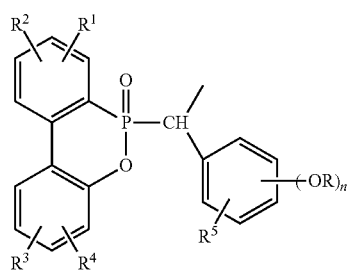
z1

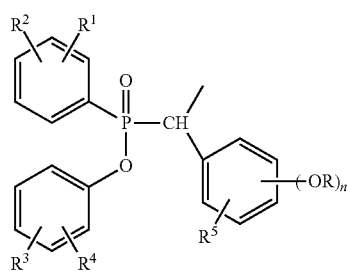
z2

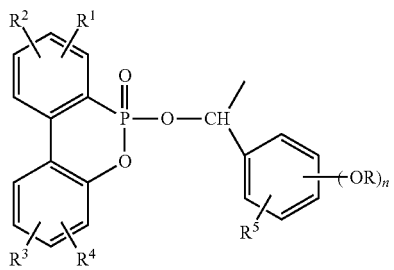
z3

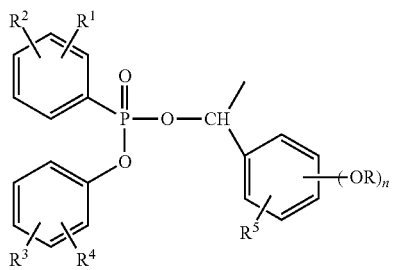
z4

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.)]

is reacted with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so as to form an ester bond and bond two structural segments (i) to each other via an ester residue of the (A2) and in which the other hydroxyl group in the structural segment (i) is reacted with an aromatic monocarboxylic acid or a halide thereof or a C2-6 saturated aliphatic acid or a halide or anhydride thereof (A3) to form an ester bond;

a novel active ester resin (Ay-2) having a resin structure in which some of hydroxyl groups of a phenolic resin (A1y) having a novolac-type phenolic resin structure and having, as a substituent on the aromatic nucleus, a structural segment selected from the group consisting of partial structures represented by structural formula z1 to z4 below:

[Chem. 39]

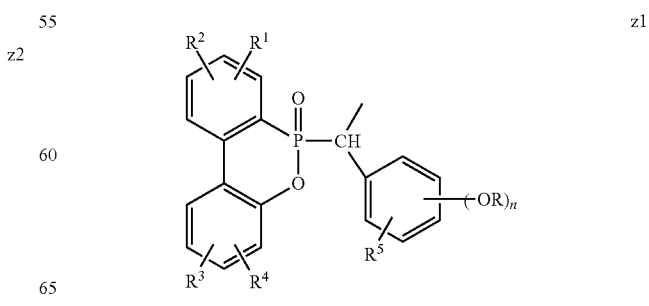
z1

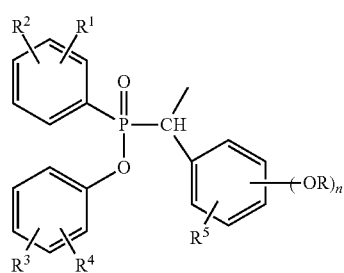

z2

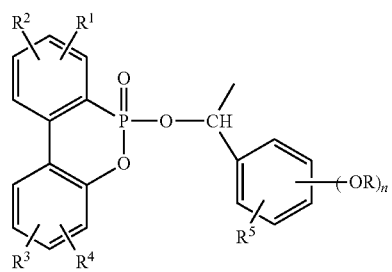

z3

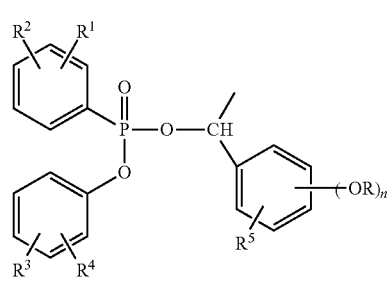

z4

(In structural formula z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.)

with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) to form ester bonds and bond two structural segments (i) to each other via an ester residue of the (A2) and in which all or some of the rest of hydroxyl groups of the phenolic resin (A1y) are reacted with an aromatic monocarboxylic acid or a halide thereof or a C2-6 saturated aliphatic acid or a halide or anhydride thereof (A3) so as to form ester bonds; and an active ester resin (Az-2) having a resin structure in which some of hydroxyl groups of a phenolic resin (A1z) having a structural segment (ii) selected from the group consisting of partial structures represented by structural formula (II) below:

[Chem. 40]

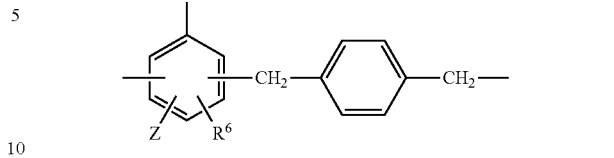

(II)

[In structural formula (II) above, $R^6$ represents a hydrogen atom or a C1-6 alkyl group, z represents a structural segment selected from the group consisting of a hydrogen atom and partial structures represented by structural formulae z1 to z4 below:

[Chem. 41]

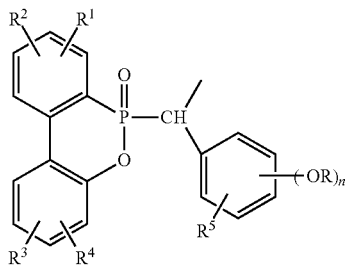

z1

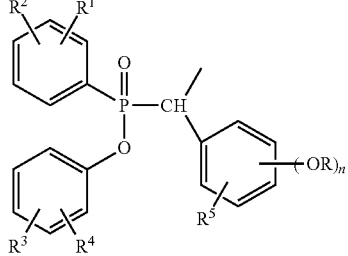

z2

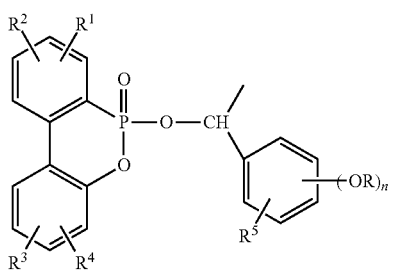

z3

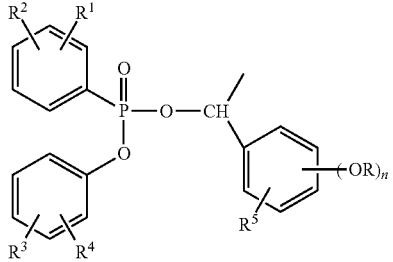

z4

(In structural formulae z1 to z4 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on the aromatic nucleus and is in the range of 1 to 3.), and at least one of Z represents a structural segment selected from the partial structures represented by structural formulae z1 to z4 above]

with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid so as to form ester bonds and bond two structural segments (i) to each other via an ester residue of the (A2) and in which all of some of the rest of hydroxyl groups of the phenolic resin are reacted with an aromatic carboxylic acid or a halide thereof or a C2-6 saturated aliphatic acid or a halide or anhydride of a C2-6 saturated aliphatic acid so as to form ester bonds.

In the active ester resin (Ax-2), (Ay-2), or (Az-2), partial structures represented by structural formulae z1 and z2 are preferable among the partial structures represented by structural formulae z1 to z4 since a cured product having particularly high heat resistance is obtained. A partial structure represented by structural formula z1 is particularly preferable.

In the active ester resin (Ay-2) or (Az-2), the ratio of phenolic hydroxyl groups that form ester bonds among all phenolic hydroxyl groups is preferably 50% by mol or more since the resulting active ester resin exhibits high heat resistance and flame retardancy. The ratio is more preferably 70% by mol or more and particularly preferably 80% by mol or more since the dielectric constant and loss tangent of a cured coating film of the resulting active ester resin are further decreased.

In the active ester resin (Ay-2) or (Az-2), the ratio of phenolic hydroxyl groups that form ester bonds with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) relative to all phenolic hydroxyl groups that form ester bonds is preferably in the range of 1% to 40% by mol and the ratio of phenolic hydroxyl groups that form ester bonds with an aromatic monocarboxylic acid or a halide thereof or a C2-6 saturated aliphatic acid or a halide or anhydride thereof (A3) is preferably in the range of 60% to 98% by mol. Furthermore, the ratio of phenolic hydroxyl groups that form ester bonds with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) relative to all phenolic hydroxyl groups that form ester bonds is more preferably in the range of 5% to 35% by mol and the ratio of hydroxyl groups that form ester bonds with an aromatic monocarboxylic acid or a halide thereof or a C2-6 saturated aliphatic acid or a halide or anhydride thereof (A3) is more preferably in the range of 65% to 95% by mol since the dielectric constant and loss tangent can be further decreased.

Each of the active ester resins described in detail above preferably has a softening point in the range of 80° C. to 200° C. and more preferably in the range of 90° C. to 170° C. since such an active ester resin exhibits high solubility in organic solvents and is thus suitable for a material of a circuit board varnish and can exhibits flame retarding performance not achievable in related art.

In using the active ester resin for circuit board usage, it is desirable to improve dielectric properties and moisture resistance after curing by further decreasing the functional group concentration in the epoxy resin. Meanwhile, if the molecular weight in the active ester resin is small, the active ester resin has degraded solubility in organic solvents and it becomes difficult to use the active ester resin in a circuit board varnish. Accordingly, the active ester resin preferably has a functional group equivalent in the range of 240 to 400 g/eq. and more preferably in the range of 300 to 370 g/eq. on the basis of the total number of aryl carbonyloxy groups and phenolic hydroxyl groups in the resin structure.

A thermosetting resin composition according to the present invention contains an active ester resin (A) and an epoxy resin (B) as essential components and the active ester resin (A) is the active ester resin of the present invention described above.

Examples of the epoxy resin (B) used in the thermosetting resin composition of the present invention include bisphenol A-type epoxy resins, bisphenol F-type epoxy resins, biphenyl-type epoxy resins, tetramethylbiphenyl-type epoxy resins, polyhydroxynaphthalene-type epoxy resins, phenol novolac-type epoxy resins, cresol novolac-type epoxy resins, triphenylmethane-type epoxy resins, tetraphenylethane-type epoxy resins, dicyclopentadiene-phenol addition reaction-type epoxy resins, phenol aralkyl-type epoxy resins, naphthol novolac-type epoxy resins, naphthol aralkyl-type epoxy resins, naphthol-phenol co-condensed novolac-type epoxy resins, naphthol-cresol co-condensed novolac-type epoxy resins, aromatic hydrocarbon formaldehyde resin-modified phenolic resin-type epoxy resins, and biphenyl-modified novolac-type epoxy resins. Among these epoxy resins, tetramethyl biphenol-type epoxy resins, biphenyl aralkyl-type epoxy resins, polyhydroxynaphthalene-type epoxy resins, and novolac-type epoxy resins are preferably used since a cured product having good flame retardancy is obtained. Dicyclopentadiene-phenol addition reaction-type epoxy resins are preferable from the viewpoint of obtaining a cured product having good dielectric properties and moisture resistance. In particular, novolac-type epoxy resins are preferable since a cured product that strikes a good balance between dielectric properties and flame retardancy is obtained.

The amounts of the active ester resin (A) and the epoxy resin (B) contained in the thermosetting resin composition of the present invention are preferably such amounts that 0.8 to 1.2 equivalents of epoxy groups in the epoxy resin (B) are present per a total of 1 equivalent of hydroxyl groups in the active ester resin (A) and the ester bonding sites on the aromatic nucleus from the viewpoint of improving the curability and various physical properties of the cured product. The ester bonding sites on the aromatic nucleus refer to ester bonding sites generated by esterification induced by the reaction between hydroxyl groups in the structural formula (I) and an aromatic monocarboxylic acid or a halide thereof or a C2-6 saturated aliphatic acid or a halide or anhydride thereof.

The thermosetting resin composition of the present invention may also contain an epoxy resin curing agent in addition to the active ester resin (A) and the epoxy resin (B). Examples of the epoxy resin curing agent that can be used include curing agents such as amine-based compounds, amide-based compounds, acid anhydride-based compounds, and phenolic compounds. Specific examples of the amine-based compounds include diaminodiphenylmethane, diethylenetriamine, triethylenetetramine, diaminodiphenylsulfone, isophoronediamine, imidazole, $BF_3$-amine complexes, and guanidine derivatives. Examples of the amide-based compounds include dicyanamide and a polyamide resin synthesized from a dimer of linoleic acid and ethylenediamine. Examples of the acid anhydride-based compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Examples of the phenolic compounds include polyvalent phenolic compounds such as phenol novolac resins, cresol novolac resins, aromatic hydrocarbon formaldehyde resin-modified phenolic resins, dicyclopentadiene phenol addition-type resins, phenol aralkyl resins, naphthol aralkyl resins, trimethylolmethane resins, tetraphenylolethane resins, naphthol novolac resins, naphthol-phenol co-condensed novolac resins, naphthol-cresol co-condensed novolac resins, biphenyl-modified phenolic resins (polyvalent phenolic compounds in which phenol nuclei are bonded to each other with a bismethylene group), biphenyl-modified naphthol resins (polyvalent naphthol compounds in which phenol nuclei are bonded to each other with a bismethylene group), and aminotriazine-modified phenolic resins (polyvalent phenolic compounds in which phenol nuclei are bonded to each other with melamine, benzoguanamine, or the like).

Of these, those which contain many aromatic skeletons in the molecular structure is preferred from the viewpoint of the flame retarding effect. To be specific, phenol novolac resins, cresol novolac resins, aromatic hydrocarbon formaldehyde resin-modified phenolic resins, phenol aralkyl resins, naphthol aralkyl resins, naphthol novolac resins, naphthol-phenol co-condensed novolac resins, naphthol-cresol co-condensed novolac resins, biphenyl-modified phenolic resins, biphenyl-modified naphthol resins, and aminotriazine-modified phenolic resins are preferable for their good flame retardancy.

In the case where the epoxy resin curing agent described above is used in combination, the amount of the curing agent used is preferably in the range of 10 to 50% by mass from the viewpoint of dielectric properties.

If needed, the thermosetting resin composition of the present invention can contain a curing accelerator. Various compounds can be used as the curing accelerator. Examples thereof include phosphorus-based compounds, tertiary amines, imidazole, organic acid metal salts, Lewis acids, and amine complex salts. For the build-up material usages and circuit board usages, dimethylaminopyridine and imidazole are preferable since they have good heat resistance, dielectric properties, and soldering resistance. For the semiconductor sealing material usages, the phosphorus-based compound is preferably triphenyl phosphine and the tertiary amine is preferably 1,8-diazabicyclo-[5.4.0]-undecene (DBU) since they have good curability, heat resistance, electric properties, and moisture resistance reliability.

The thermosetting resin composition of the present invention described in detail above is characterized by high solvent solubility as discussed above. Accordingly, the thermosetting resin composition preferably contains an organic solvent (C) in addition to the respective components described above. Examples of the organic solvent (C) that can be used include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. The choice of the organic solvent can be appropriately made and the appropriate amount of use can be selected depending on the usage. For example, for printed circuit board usage, a polar solvent having a boiling point of 160° C. or less, such as methyl ethyl ketone, acetone, or 1-methoxy-2-propanol, is preferable and is preferably used at a ratio that can yield a non-volatile content of 40% to 80% by mass. For build-up adhesive film usage, ketones such as acetone, methyl ethyl ketone, and cyclohexanone, acetates such as ethyl acetate, butyl acetate, cellosolve acetate, propylene glycol monomethyl ether acetate, and carbitol acetate, carbitols such as cellosolve and butyl carbitol, aromatic hydrocarbons such as toluene and xylene, dimethyl formamide, dimethyl acetamide, and N-methylpyrrolidone are preferably used as the organic solvent (C), for example. The organic solvent is preferably used at a ratio that can yield a non-volatile content of 30% to 60% by mass.

If needed, the thermosetting resin composition of the present invention may also contain an additional thermosetting resin. Examples of the additional thermosetting resin that can be used here include cyanate ester compounds, vinyl benzyl compounds, acrylic compounds, and maleimide compounds. In the case where the additional thermosetting resin is used in addition, the amount thereof is not particularly limited as long as the effects of the present invention are not impaired but is preferably in the range of 1% to 80% by weigh relative to the thermosetting resin composition of the present invention.

In order for the thermosetting resin composition of the present invention to exhibit flame retardancy in, for example, the field of printed circuit boards, a halogen-free flame retardant substantially free of halogen atoms may be added as long as the reliability is not degraded.

Examples of the halogen-free flame retardant include phosphorus-based flame retardants, nitrogen-based flame retardants, silicone-based flame retardants, inorganic flame retardants, and organic metal salt-based flame retardants. No limitation is imposed on the usage. For example, one halogen-free flame retardant can be used alone, two or more halogen-free flame retardants belonging to the same system can be used, or two or more halogen-free flame retardants belonging to different systems can be used.

The phosphorus-based flame retardant can be inorganic or organic. Examples of the inorganic compounds include red phosphorus, ammonium phosphates such as monoammonium phosphate, diammonium phosphate, triammonium phosphate, and ammonium polyphosphate, and inorganic nitrogen-containing phosphorus compounds such as phosphoric amide.

The red phosphorus is preferably surface-treated to prevent hydrolysis and the like. Examples of the surface treatment include (i) a method of coating the surfaces with an inorganic compound such as magnesium hydroxide, aluminum hydroxide, zinc hydroxide, titanium hydroxide, bismuth oxide, bismuth hydroxide, bismuth nitrate, or any mixture of these, (ii) a method of coating the surfaces with a mixture of a thermosetting resin such as a phenolic resin and an inorganic compound such as magnesium hydroxide, aluminum hydroxide, zinc hydroxide, or titanium hydroxide, and (iii) a method of coating the surfaces with an inorganic compound such as magnesium hydroxide, aluminum hydroxide, zinc hydroxide, or titanium hydroxide, and then coating the inorganic compound with a thermosetting resin such as a phenolic resin to provide double coating.

Examples of the organic phosphorus-based compounds include commodity organic phosphorus compounds such as phosphate ester compounds, phosphonic acid compounds, phosphinic acid compounds, phosphine oxide compounds, phosphorane compounds, and organic nitrogen-containing phosphorus compounds, and cyclic organic phosphorus compounds and derivatives thereof obtained by reacting the cyclic organic phosphorus compounds with compounds such as epoxy resins and phenolic resins, such as 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide.

The amounts of these compounds contained are appropriately selected based on the type of the phosphorus-based flame retardant, other components of the thermosetting resin composition, and the desired degree of flame retardancy. For example, in the case where red phosphorus is used as a halogen-free flame retardant in 100 parts by mass of the thermosetting resin composition containing the active ester resin (A), the epoxy resin (B), the halogen-free flame retardant, and all other components such as a filler, additives, etc., 0.1 to 2.0 parts by mass of red phosphorus is preferably contained. In the case where an organic phosphorus compound is used, preferably 0.1 to 10.0 parts by mass and more preferably 0.5 to 6.0 parts by mass of the organic phosphorus compound is contained.

In the case where the phosphorus-based flame retardant is used, hydrotalcite, magnesium hydroxide, boron compounds, zirconium oxide, black dyes, calcium carbonate, zeolite, zinc molybdate, activated carbon, etc., may be used in combination with the phosphorus-based flame retardant.

Examples of the nitrogen-based flame retardant include a triazine compound, a cyanuric acid compound, an isocyanuric acid compound, and phenothiazine. A triazine compound, a cyanuric acid compound, and an isocyanuric acid compound are preferred.

Examples of the triazine compound include melamine, acetoguanamine, benzoguanamine, melon, melam, succinoguanamine, ethylene dimelamine, melamine polyphosphate, triguanamine, aminotriazine sulfate compounds such as guanylmelamine sulfate, melem sulfate, and melam sulfate, the aminotriazine-modified phenolic resin described above, and a compound obtained by modifying the aminotriazine-modified phenolic resin with tung oil, isomerized linseed oil, or the like Specific examples of the cyanuric acid compound include cyanuric acid and melamine cyanurate.

The amount of the nitrogen-based flame retardant contained is appropriately selected based on the type of the nitrogen-based flame retardant, other components of the thermosetting resin composition, and the desired degree of the flame retardancy. For example, the amount of the nitrogen-based flame retardant is preferably 0.05 to 10 parts by mass and more preferably 0.1 to 5 parts by mass in 100 parts by mass of the thermosetting resin composition containing the active ester resin (A), the epoxy resin (B), the halogen-free flame retardant, and all other components such as a filler and additives.

In the case where the nitrogen-based flame retardant is used, a metal hydroxide, a molybdenum compound, etc., may be used in combination.

The silicone-based flame retardant may be any organic compound that contains a silicon atom. Examples thereof include silicone oil, silicone rubber, and silicone resins.

The amount of the silicone-based flame retardant contained is appropriately selected based on the type of the silicone-based flame retardant, other components of the thermosetting resin composition, and the desired degree of flame retardancy. For example, 0.05 to 20 parts by mass of the silicone-based flame retardant is preferably contained in 100 parts by mass of the thermosetting resin composition that contains the active ester resin (A), the epoxy resin (B), the halogen-free flame retardant, and all other components such as a filler and additives. The silicone-based flame retardant may be used in combination with a molybdenum compound, alumina, etc.

Examples of the inorganic flame retardant include metal hydroxides, metal oxides, metal carbonate salt compounds, metal powder, boron compounds, and low-melting-point glass.

Specific examples of the metal hydroxide include aluminum hydroxide, magnesium hydroxide, dolomite, hydrotalcite, calcium hydroxide, barium hydroxide, and zirconium hydroxide.

Specific examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Specific examples of the metal carbonate salt compounds include zinc carbonate, magnesium carbonate, calcium carbonate, barium carbonate, basic magnesium carbonate, aluminum carbonate, iron carbonate, cobalt carbonate, and titanium carbonate.

Specific examples of the metal powder include aluminum, iron, titanium, manganese, zinc, molybdenum, cobalt, bismuth, chromium, nickel, copper, tungsten, and tin.

Specific examples of the boron compounds include zinc borate, zinc metaborate, barium metaborate, boric acid, and borax.

Specific examples of the low-melting-point glass include glassy compounds such as CEEPREE (Bokusui Brown Co., Ltd.), hydrated glass $SiO_2$—$MgO$—$H_2O$, and compounds based on $PbO$—$B_2O_3$, $ZnO$—$P_2O_5$—$MgO$, $P_2O_5$—$B_2O_3$—$PbO$—$MgO$, $P$—$Sn$—$O$—$F$, $PbO$—$V_2O_5$—$TeO_2$, $Al_2O_3$—$H_2O$, and lead borosilicate.

The amount of the inorganic flame retardant contained is appropriately selected based on the type of the inorganic flame retardant, other components of the thermosetting resin composition, and the desired degree of flame retardancy. For example, the amount of the inorganic flame retardant is preferably 0.05 to 20 parts by mass and more preferably 0.5 to 15 parts by mass in 100 parts by mass of the thermosetting resin composition that contains the active ester resin (A), the epoxy resin (B), the halogen-free flame retardant, and all other components such as a filler and additives.

Examples of the organic metal salt-based flame retardant include ferrocene, acetylacetonate metal complexes, organic metal carbonyl compounds, organic cobalt salt compounds, organic sulfonic acid metal salts, and a compound in which a metal atom and an aromatic compound or a heterocyclic compound are ion-bonded or coordinate-bonded to each other.

The amount of the organic metal salt flame retardant contained is appropriately selected based on the type of the organic metal salt-based flame retardant, other components of the thermosetting resin composition, and the desired degree of flame retardancy. For example, 0.005 to 10 parts by mass of the organic metal salt-based flame retardant is preferably contained in 100 parts by mass of the thermosetting resin composition that contains the active ester resin (A), the epoxy resin (B), the halogen-free flame retardant, and all other components such as a filler and additives.

The thermosetting resin composition of the present invention may contain an inorganic filler if needed. Examples of the inorganic filler include fused silica, crystalline silica, alumina, silicon nitride, and aluminum hydroxide. In the case where the amount of the inorganic filler is to be particularly large, fused silica is preferably used. Fused silica may be crushed or spherical. In order to increase the amount of the fused silica contained and suppress the increase in melt viscosity of the forming materials, spherical fused silica is preferably mainly used. In order to increase the amount of the spherical silica contained, the particle size distribution of spherical silica is preferably appropriately adjusted. The filling ratio is preferably high considering flame retardancy and is preferably 20% by mass or more relative to the entire amount of the thermosetting resin composition. When the composition is to be used for conductive paste usage etc., a conductive filler such as silver powder or copper powder can be used.

The thermosetting resin composition of the present invention can contain various blend compounds such as a silane coupling agent, a mold releasing agent, a pigment, and an emulsifier as needed.

The thermosetting resin composition of the present invention is obtained by homogeneously mixing the components described above. The thermosetting resin composition of the present invention containing the active ester resin (A) of the present invention, the epoxy resin (B), and if needed, the curing accelerator can be easily formed into a cured product by the same method as those known in related art. Examples of the cured product include molded cured products such as a laminate, a cast molded product, an adhesive layer, a coating film, and a film.

Examples of the usage of the thermosetting resin composition of the present invention include rigid printed wiring board materials, flexible wiring board resin compositions, circuit board insulating materials such as interlayer insulating materials for build-up substrates, semiconductor sealing materials, conductive paste, adhesive films for building up, resin mold casting materials, and adhesives. Among these various usages, for the rigid printed wiring board materials, electronic circuit board insulating materials, and adhesive films for building up, the composition can be used as an insulating material for a so-called electronic part-embedded substrate in which passive parts such as capacitors and active parts such as IC chips are embedded inside the board. Due to the properties such as high flame retardancy, high heat resistance, low thermal expansion, and solvent solubility, the composition is preferably used in rigid printed wiring board materials, flexible wiring board resin compositions, circuit board materials such as interlayer insulating materials for build-up substrates, and semiconductor sealing materials among these usages.

A circuit board according to the present invention is obtained by preparing a varnish by diluting a thermosetting resin composition in an organic solvent, shaping the varnish into a plate, stacking a copper foil on the plate, and performing thermal press forming. To be specific, in producing a rigid printed wiring board, for example, an organic solvent is added to a thermosetting resin composition in the form of a varnish already containing the organic solvent so as to form a varnish, a reinforcing substrate is impregnated with the varnish, the varnish is semi-cured to obtain a prepreg of the present invention, a copper foil is superimposed on the prepreg, and thermal press bonding is performed. The reinforcing substrate that can be used here may be paper, glass cloth, glass unwoven cloth, aramid paper, aramid cloth, a glass mat, glass roving cloth, or the like. This method can be described in detail as follows. First, a varnish-type thermosetting resin composition is heated to a heating temperature suitable for the type of the solvent used, preferably a temperature of 50 to 170° C., to obtain a prepreg, which is a cured product. The mass ratio of the thermosetting resin composition to the reinforcing substrate is not particularly limited but the resin content in the prepreg is usually preferably adjusted to 20 to 60% by mass. Then the prepreg obtained as above is laminated by a conventional method, a copper foil is superimposed thereon, and thermal press-bonding is performed at a pressure 1 to 10 MPa at 170° C. to 250° C. for 10 minutes to 3 hours. As a result, a desired circuit board can be obtained.

A flexible wiring board is produced from the thermosetting resin composition of the present invention as follows: An active ester resin (A), an epoxy resin (B), and an organic solvent are mixed and applied to an electrically insulating film by using a coating machine such as a reverse roll coater, a comma coater, or the like. The applied mixture is then heated at 60° C. to 170° C. for 1 to 15 minutes using a heater to evaporate the solvent and form a B-stage adhesive composition. A metal foil is thermally press-bonded onto the adhesive by using a heating roll or the like. The press bonding pressure applied at this stage is preferably 2 to 200 N/cm and the press-bonding temperature is preferably 40° C. to 200° C. The process may end here if sufficient bonding performance is obtained. If complete curing is needed, post curing is preferably conducted at 100° C. to 200° C. for 1 to 24 hours. The thickness of the adhesive composition film after final curing is preferably in the range of 5 to 100 μm.

An interlayer insulating material for a build-up substrate can be obtained from the thermosetting resin composition of the present invention as follows: The thermosetting resin composition to which rubber, a filler, and other appropriate compounds are added is applied by a spray coating method, a curtain coating method, or the like, to a wiring board having a circuit formed therein, and then cured. Holes such as particular through holes are then formed if needed, the surface is treated with a roughening agent and washed with hot water to form irregularities, and plating with metal such as copper is performed. The plating method is preferably electroless plating or electric plating. Examples of the roughening agent include oxidizers, alkalis, and organic solvents. This operation is repeated as needed to alternately build-up a resin insulating layer and a conductor layer having a particular circuit pattern so as to form a build-up substrate. It should be noted here that formation of holes for through hole portions is performed after formation of the outermost resin insulating layer. It is also possible to form a build-up substrate by thermally press-bonding a resin-clad copper foil, which is prepared by semi-curing the resin composition on a copper foil, onto a wiring board having a circuit formed therein at 170° C. to 250° C. According to this method, the step of roughening the surface and performing plating can be omitted.

A semiconductor sealing material is produced from the thermosetting resin composition of the present invention as follows: An active ester resin (A), an epoxy resin (B), and, if needed, a blend compound such as an inorganic filler are thoroughly melt-mixed to a homogeneity by using an extruder, a kneader, a roller, or the like as needed. Usually, silica is used as the inorganic filler. In such a case, 70% to 95% by mass of the inorganic filler is contained in the thermosetting resin composition to form a semiconductor sealing material of the present invention. An example of a semiconductor package forming is a method including shaping the composition by using a casting die, a transfer molding machine, an injection molding machine, or the like and heating the composition at 50° C. to 200° C. for 2 to 10 hours to obtain a semiconductor device as a molded product.

An example of a method for producing a build-up adhesive film from the thermosetting resin composition of the present invention is a method that includes applying the thermosetting resin composition of the present invention to a supporting film to form a resin composition layer to form an adhesive film for a multilayer printed wiring board.

In the case where the thermosetting resin composition of the present invention is used in an adhesive film for building-up, it is important that the adhesive film soften under temperature conditions (usually 70° C. to 140° C.) of laminating in a vacuum laminating method and exhibit flowability (resin flow) enabling impregnation of via holes or through holes in the circuit board with the resin. The components described above are preferably blended to exhibit such properties.

The diameter of through holes in a multilayer printed wiring board is usually 0.1 to 0.5 mm and the depth is usually 0.1 to 1.2 mm. Impregnation with the resin is preferably enabled within these ranges. In the case where both surfaces of the circuit board are to be laminated, about ½ of the through holes are preferably impregnated with the resin.

The adhesive film described above can be produced by preparing a varnish-type thermosetting resin composition of the present invention, applying the varnish-type composition to a surface of a supporting film, and drying the organic solvent by heating or blowing hot air so as to form a layer (α) of the thermosetting resin composition.

The layer (α) formed is usually as thick as or thicker than a conductor layer. Since the thickness of a conductor layer of a circuit board is usually in the range of 5 to 70 μm, the resin composition layer preferably has a thickness of 10 to 100 μm.

The layer (α) may be protected with a protective film described below. Attachment of dust onto and scratching in the surface of the resin composition layer can be prevented by providing a protective film.

Examples of the supporting film and the protective film include those made of polyolefins such as polyethylene, polypropylene, and polyvinyl chloride, polyesters such as polyethylene terephthalate (hereinafter may be simply referred to as "PET") and polyethylene naphthalate, polycarbonate, polyimide, releasing paper, and metal foils such as copper foils and aluminum foils. The supporting film and the protective film may be subjected to a MAD treatment, a corona treatment, or a releasing treatment in advance.

The thickness of the supporting film is not particularly limited but is usually 10 to 150 μm and is preferably in the range of 25 to 50 μm. The thickness of the protective film is preferably 1 to 40 μm.

The supporting film is separated after being laminated onto a circuit board or after being heated and cured to form an insulating layer. By separating the supporting film after heating and curing the adhesive film, attachment of dust and the like in the curing step can be prevented. If separation is to be performed after curing, the supporting film is usually subjected to a releasing treatment in advance.

A method for producing a multilayer printed wiring board by using the adhesive film obtained as described above may include, for example, laminating the layer (α) onto one or both surfaces of a circuit board so that the layer (α) is in direct contact with the circuit board. If the layer (α) is protected with a protective film, this process is performed after removing the protective film. The laminating method may be a batch method or a continuous method using rolls. The adhesive film and the circuit board may be heated (preheated) prior to laminating.

As for the lamination conditions, the press-bonding temperature (laminating temperature) is preferably 70° C. to 140° C., the press-bonding pressure is preferably 1 to 11 kgf/cm² (9.8×10⁴ to 107.9×10⁴ N/m2), and laminating is preferably conducted at a reduced pressure of 20 mmHg (26.7 hPa) or less in terms of air pressure.

When the thermosetting resin composition of the present invention is used in conductive paste, for example, fine conductive particles may be dispersed in the thermosetting resin composition to form a composition for an anisotropic conductive film, or a paste resin composition for circuit connection and an anisotropic conductive adhesive that are liquid at room temperature may be formed.

The thermosetting resin composition of the present invention can also be used as a resist ink. An example of the method includes adding a vinyl monomer having an ethylenic unsaturated double bond and a cation polymerization catalyst serving as a curing agent to the thermosetting resin composition, adding a pigment, talc, and a filler to the resulting mixture to prepare a resist ink composition, applying the composition to a printed board by a screen printing method, and then forming a resist ink cured product.

A method for obtaining a cured product according to the present invention may include heating, for example, the composition obtained by the above-described method in the temperature range of about 20° C. to 250° C.

Therefore, according to the present invention, an environmentally friendly thermosetting resin composition having high flame retardancy can be obtained without using a halogen-based flame retardant. Due to good dielectric properties of the cured product, processing speeds of high-frequency devices can be increased. The phenolic hydroxyl group-containing resin can be efficiently and easily produced by the production method of the present invention and the molecular design that suits the target level of the performance can be realized.

EXAMPLES

The present invention will now be specifically described by using Examples and Comparative Examples. In the description below, "parts" and "%" are on a mass basis unless otherwise noted. The melt viscosity at 180° C., softening point, GPC measurement, $^{13}$C-NMR, and FD-MS spectrum were measured under the following conditions:
1) Melt viscosity at 180° C.: measured in accordance with ASTM D4287
2) Softening point measurement method: JIS K7234
3) GPC:
Measurement instrument: "HLC-8220 GPC" produced by Tosoh Corporation
Columns: Guard column "HXL-L" produced by Tosoh Corporation
+"TSK-GEL G2000HXL" produced by Tosoh Corporation
+"TSK-GEL G2000HXL" produced by Tosoh Corporation
+"TSK-GEL G3000HXL" produced by Tosoh Corporation
+"TSK-GEL G4000HXL" produced by Tosoh Corporation
Detector: RI (differential refractometer)
Data processing: "GPC-8020 model II, version 4.10" produced by Tosoh Corporation
Measurement Conditions:
    Column temperature: 40° C.
    Eluent: tetrahydrofuran
    Flow rate: 1.0 ml/min
Standard: The following monodisperse polystyrenes with known molecular weights were used in accordance with the measurement manual of "GPC-8020 model II, version 4.10":
    (Polystyrenes Used)
    "A-500" produced by Tosoh Corporation
    "A-1000" produced by Tosoh Corporation
    "A-2500" produced by Tosoh Corporation
    "A-5000" produced by Tosoh Corporation
    "F-1" produced by Tosoh Corporation
    "F-2" produced by Tosoh Corporation
    "F-4" produced by Tosoh Corporation
    "F-10" produced by Tosoh Corporation "F-20" produced by Tosoh Corporation
"F-40" produced by Tosoh Corporation
"F-80" produced by Tosoh Corporation
"F-128" produced by Tosoh Corporation
Sample: a 1.0% by mass tetrahydrofuran solution on a resin solid basis was filtered with a microfilter (50 μl).
4) $^{13}$C-NMR: "NMR GSX270" produced by JEOL Ltd.
5) FD-MS: double focusing-type mass spectrometer AX505H (FD505H) produced by JEOL Ltd.

Production Example 1

Into a flask equipped with a thermometer, a cooling tube, a distillation tube, and a stirrer, 124 g (0.59 mol) of 9,10-dihydro-9-oxa-10-phosphananthrene-10-oxide (hereinafter simply referred to as "HCA"), 78.7 g (0.59 mol) of p-anisaldehyde, and 161.2 g (1.55 mol) of a phenol novolac resin were charged and the resulting mixture was stirred at a temperature condition of 90° C. under nitrogen blowing. Then the temperature was increased to 140° C. and stirring was conducted for 4 hours. Then the temperature was increased to 160° C. and stirring was conducted for 4 hours. Then the temperature was increased to 180° C. and stirring was conducted for 2 hours. Then water was removed by heating and reducing pressure. As a result, 350 g of a phenolic resin (A1-1) having, as repeating units, a structural unit A and a structural unit B described below was obtained:

[Chem. 42]

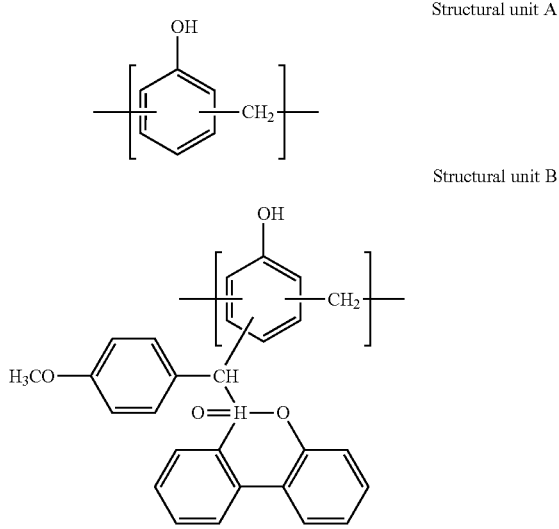

Figure 2:
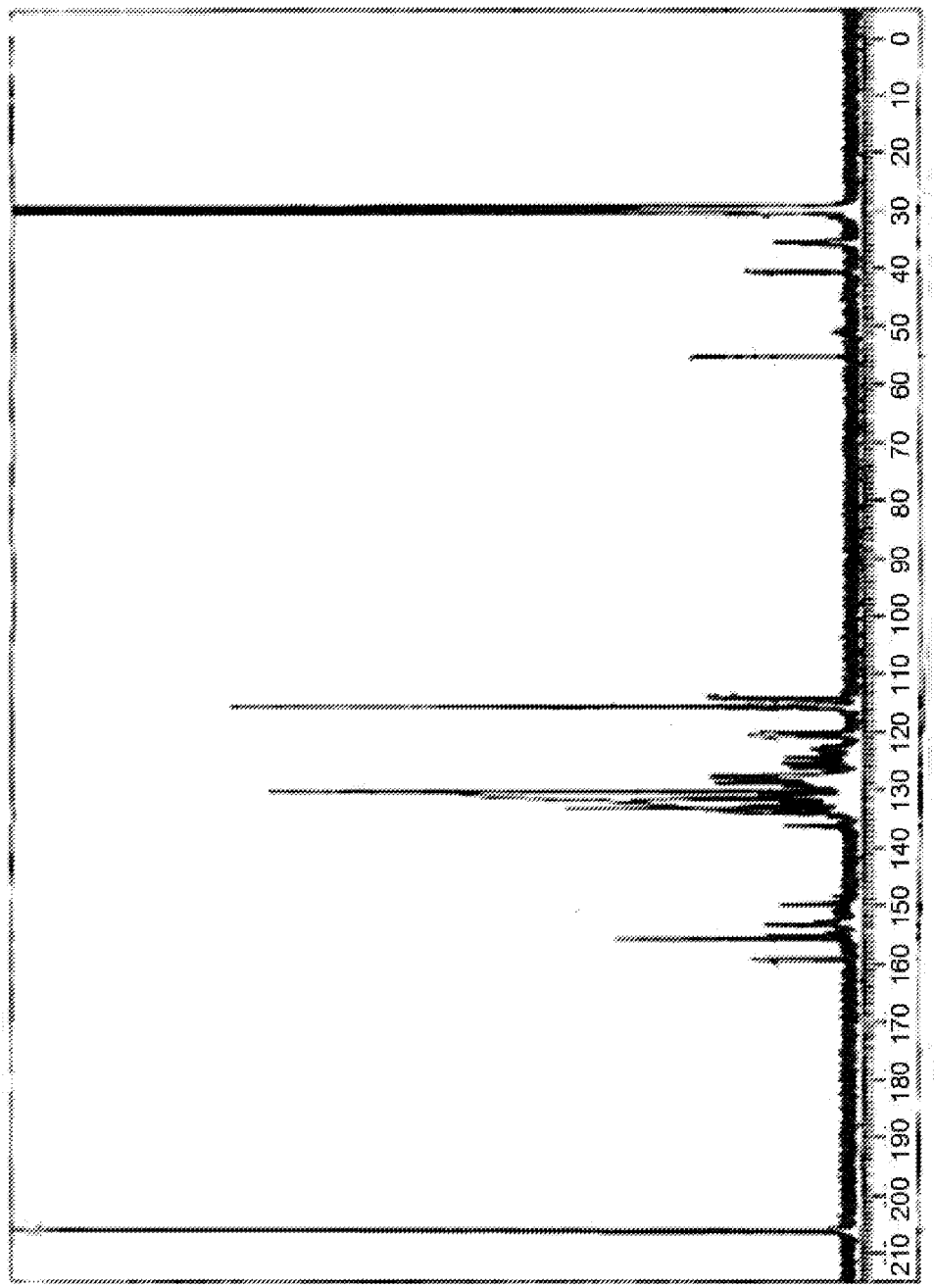
FIG. 2 is a $^{13}$C-NMR chart of the phenolic resin (A1-1) obtained in Production Example 1.
Figure 3:
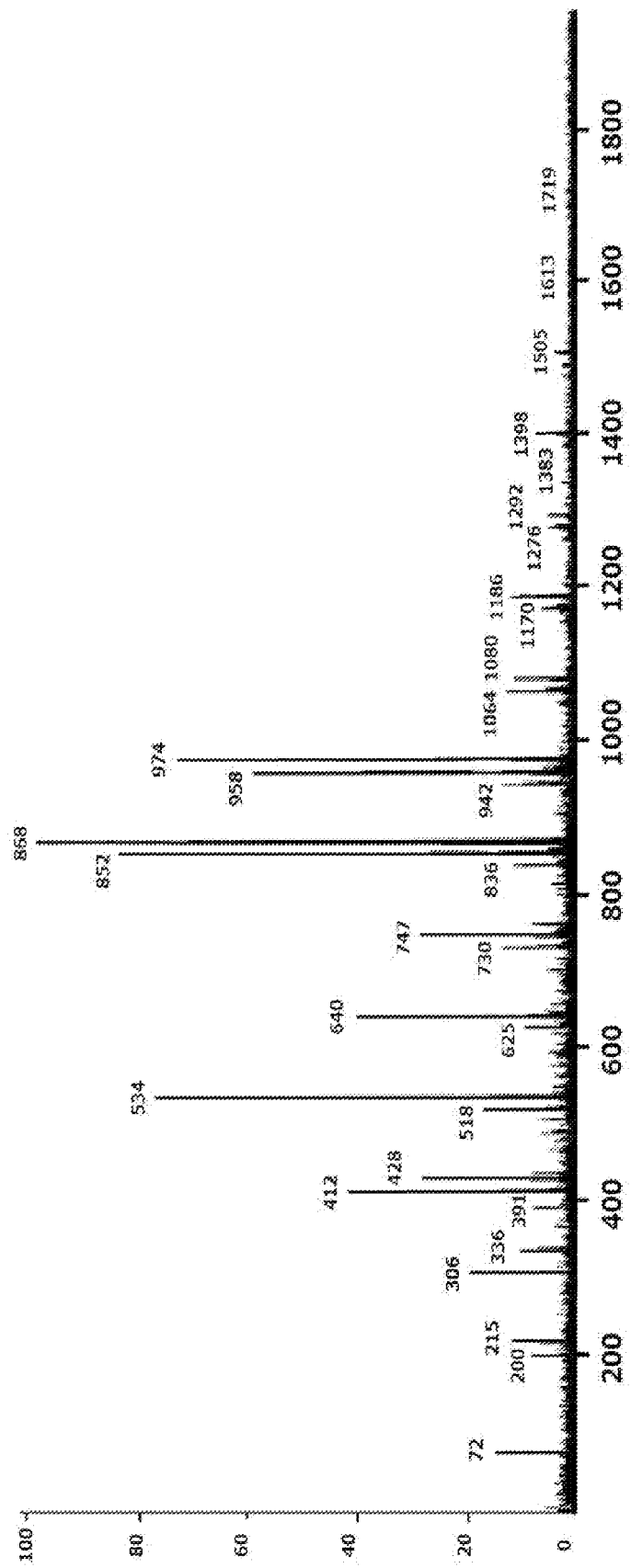
FIG. 3 is a FD-MS spectrum of the phenolic resin (A1-1) obtained in Production Example 1.

The hydroxyl equivalent of the phenolic resin (A1-1) was 228 g/eq., the softening point was 148° C., and the melt viscosity at 180° C. was 400 dPa·s. The GPC chart of the phenolic resin (A1-1) obtained is shown in FIG. 1, the $C^{13}$NMR chart is shown in FIG. 2, and the MS spectrum is shown in FIG. 3. A peak of hydroxymethylene at 77 ppm disappeared from the $C^{13}$NMR chart and a peak indicating generation of a methine skeleton was detected at about 55.3 ppm.

Production Example 2

Figure 4:
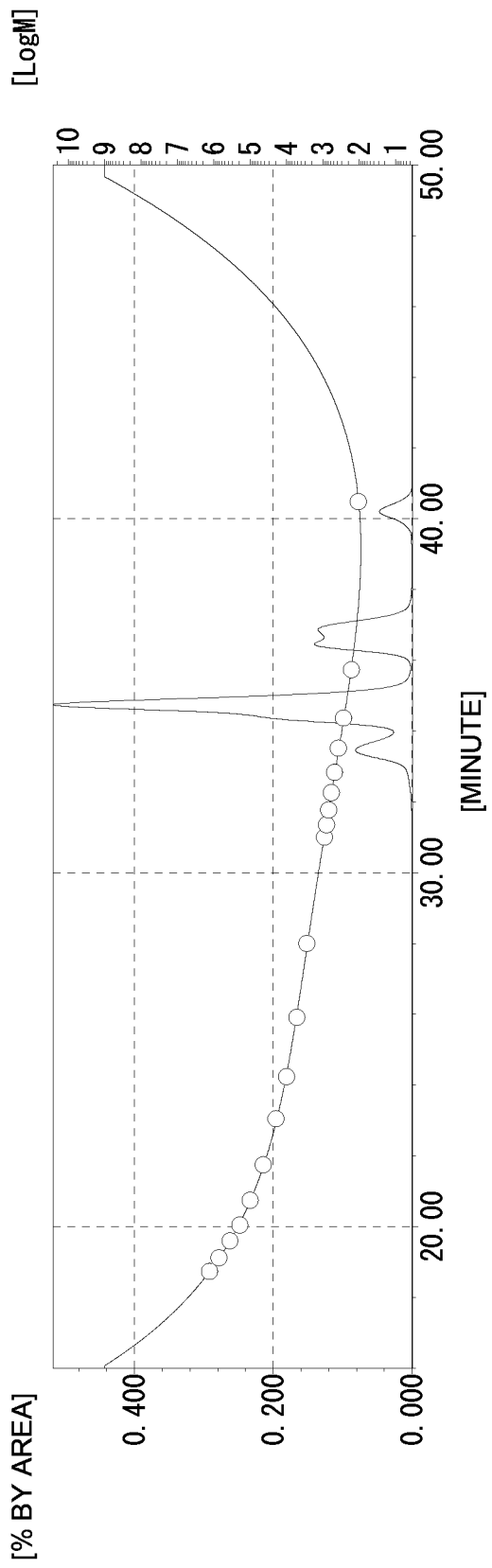
FIG. 4 is a GPC chart of a phenolic resin (A1-2) obtained in Production Example 2.

A phenolic resin (A1-2) (490 g) was obtained by the same method as in Production Example 1 except that 161.2 g (1.55 mol) of the phenol novolac resin was changed to 248 g (1.55 mol) of 2,7-dihydroxynaphthalene. The hydroxyl equivalent of the phenolic resin (A1-2) was 250 g/eq., the softening point was 140° C., and the melt viscosity at 180° C. was 300 dPa·s. The GPC chart of the phenolic resin (A1-2) obtained is shown in FIG. 4.

Production Example 3

Figure 5:
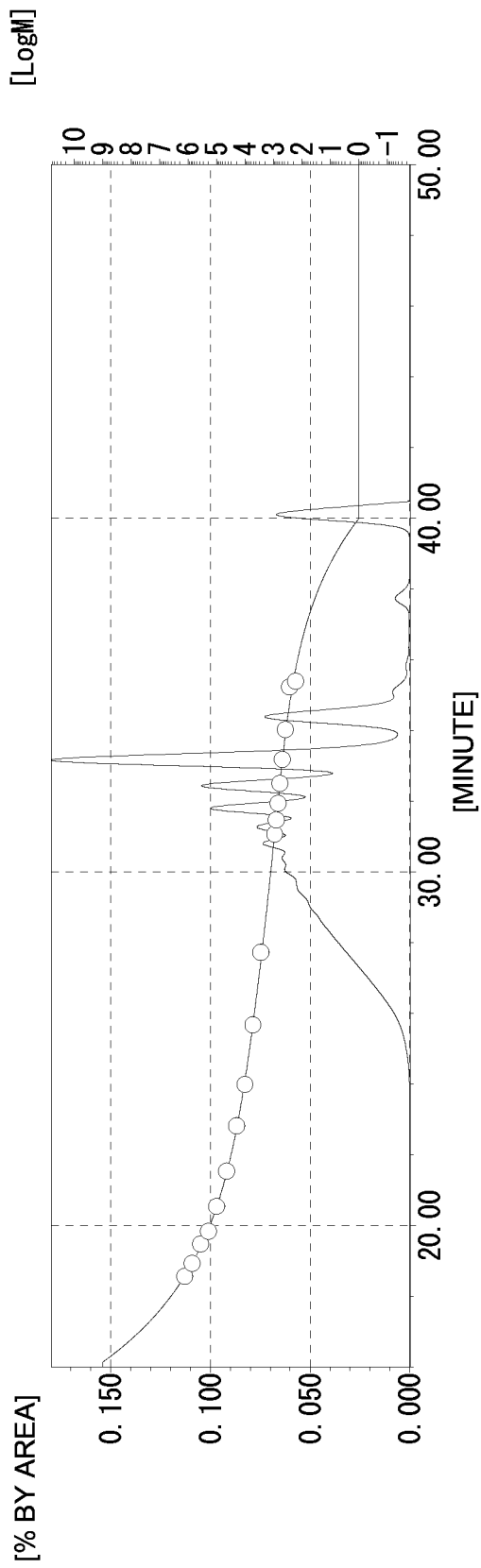
FIG. 5 is a GPC chart of a phenolic resin (A1-3) obtained in Production Example 3.

A phenolic resin (A1-3) (340 g) was obtained by the same method as in Production Example 1 except that 161.2 g (1.55 mol) of the phenol novolac resin was changed to 259 g (1.55 mol) of a phenyl aralkyl resin. The hydroxyl equivalent of the phenolic resin (A1-3) was 232 g/eq., the softening point was 102° C., and the melt viscosity at 180° C. was 1.0 dPa·s. The GPC chart of the phenolic resin (A1-3) obtained is shown in FIG. 5.

Comparative Production Example 1

Into a flask equipped with a thermometer, a cooling tube, a distillation tube, a nitrogen gas inlet tube, and a stirrer, 216 g (1.0 mol) of HCA and 71 g (1.0 mol) of a 42% by mass formalin aqueous solution were charged. The temperature was increased to 100° C. and the reaction was conducted for 4 hours. Solid precipitates produced thereby were filtered out and washed with acetone. As a result, 245 g of 2-(6-oxide-6H-dibenz<c,e><1,2>oxa-phosphorin-6-yl)methanol (hereinafter abbreviated as "ODOPM") was obtained. The melting point of the ODOPM was 152° C. to 154° C.

Comparative Production Example 2

Figure 6:
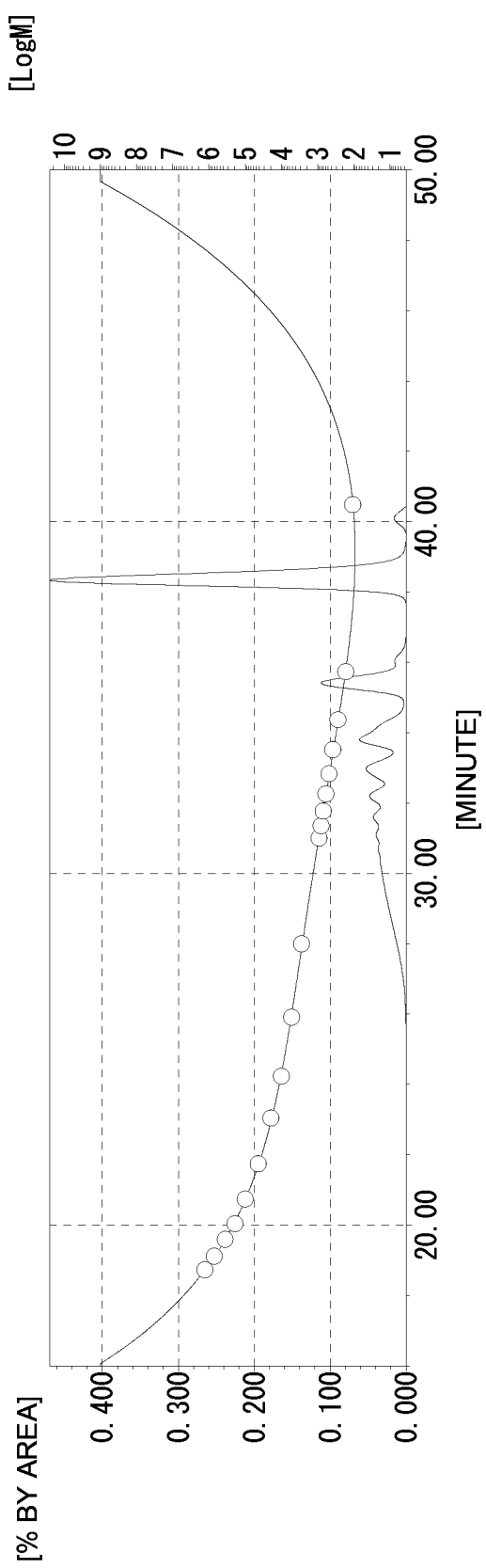
FIG. 6 is a GPC chart of a phenolic resin (A1'-1) obtained in Comparative Production Example 2.

Into a round-bottomed flask, 144 g (1.0 mol) of a phenol novolac resin was charged and the temperature was increased to 100° C. under stirring in a nitrogen stream. After the temperature increase, 230 g (1.0 mol) of ODOPM obtained in Comparative Production Example 1 was added and the resulting mixture was heated to 140° C. and retained thereat for 12 hours. Then the mixture was cooled to room temperature, filtered, and dried. As a result a phenolic resin (A1'-1) was obtained. The GPC chart of the phenolic resin (A1'-1) is shown in FIG. 6.

Comparative Production Example 3

Figure 7:
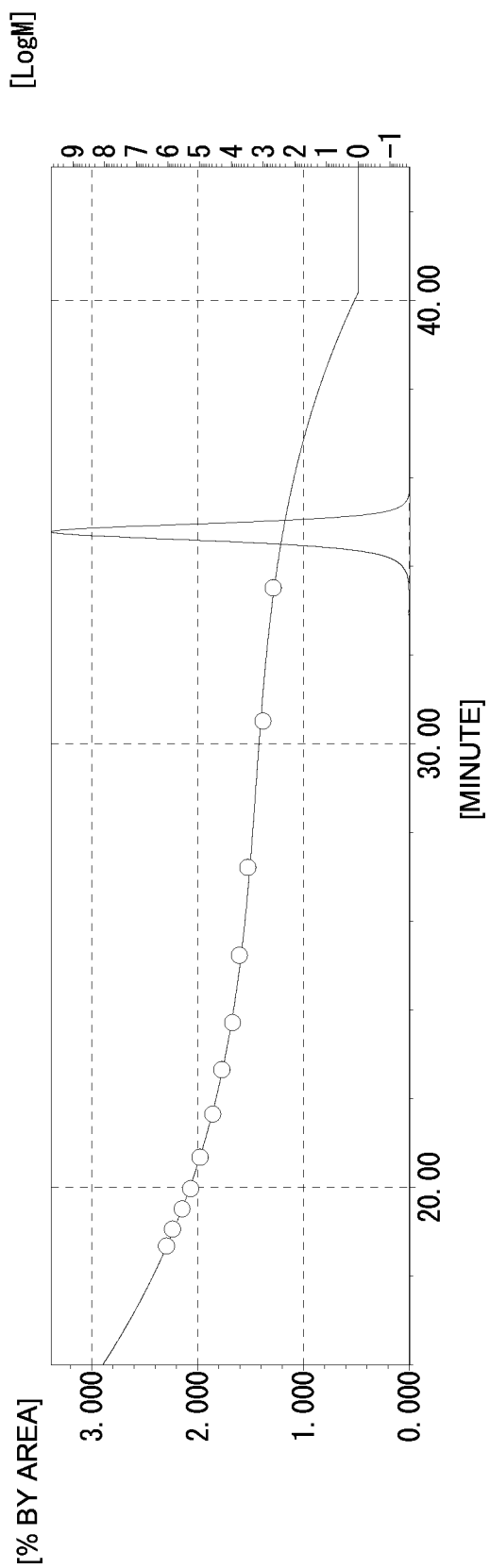
FIG. 7 is a GPC chart of a phenolic resin (A1'-2) obtained in Comparative Production Example 3.

Into a flask equipped with a thermometer, a cooling tube, a distillation tube, a nitrogen gas inlet tube, and a stirrer, 144 g (1.0 mol) of a phenol novolac resin, 216 g (1.0 mol) of HCA, and 216 g of toluene were charged. The resulting mixture was heated to 110° C. to dissolve the resin. Then 122 g (1.0 mol) of p-hydroxybenzaldehyde was charged, the resulting mixture was heated to 180° C., and reaction was conducted at 180° C. for 8 hours. The resulting mixture was filtered and dried. As a result, 335 g of a phenolic resin (A1'-2) was obtained. The melting point of the phenolic resin (A1'-2) was 286° C. The GPC chart of the phenolic resin (A1'-2) is shown in FIG. 7.

Example 1

Figure 8:
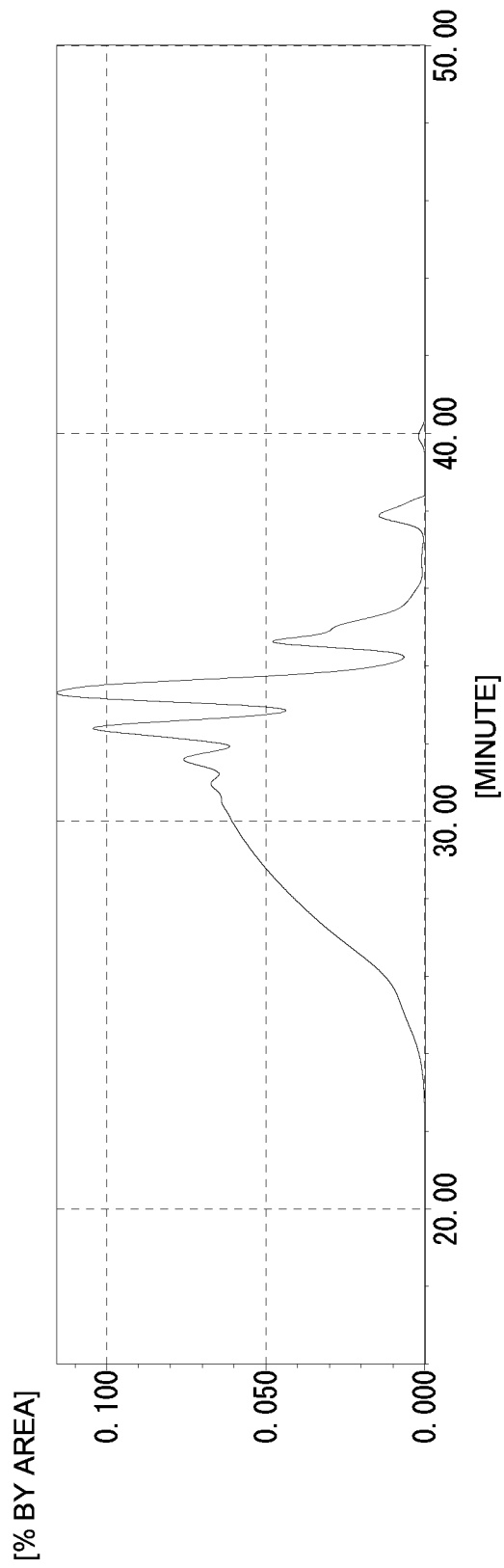
FIG. 8 is a GPC chart of an active ester resin (A-1) obtained in Example 1.
Figure 9:
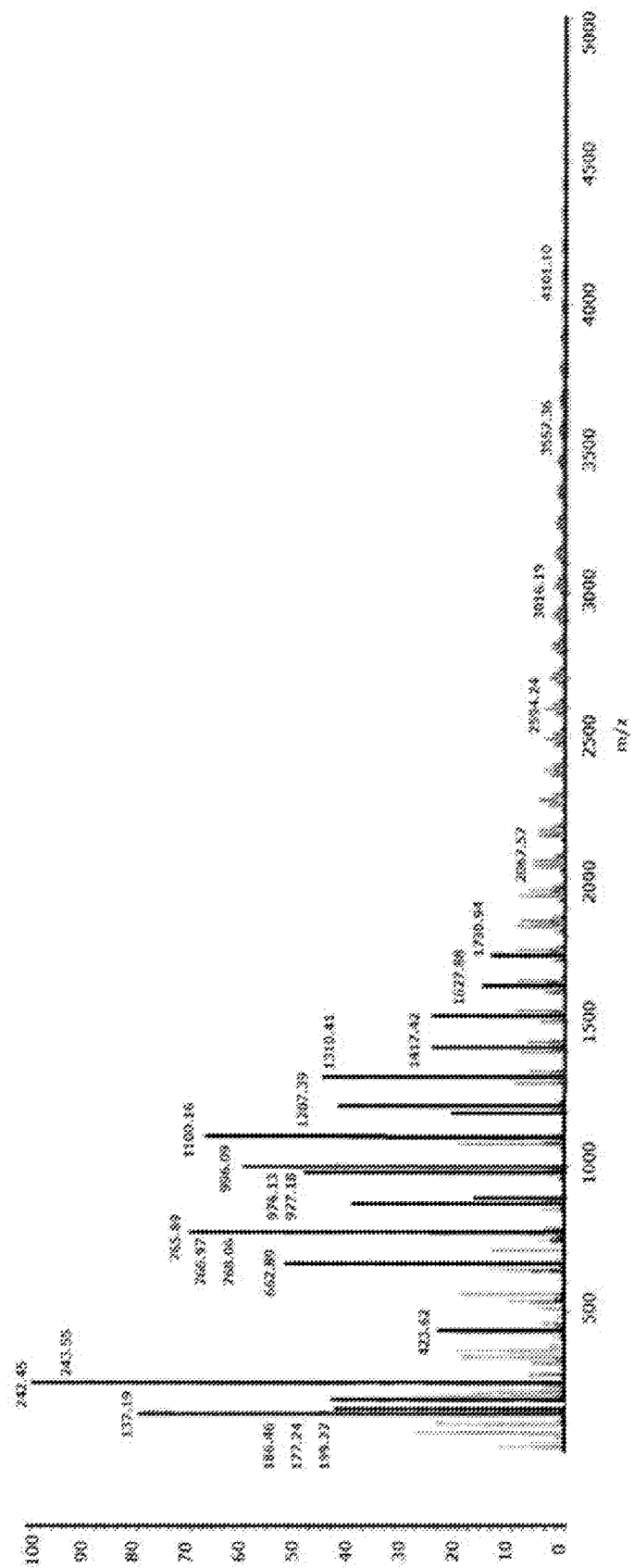
FIG. 9 is a FD-MS spectrum of the active ester resin (A-1) obtained in Example 1.
Figure 10:
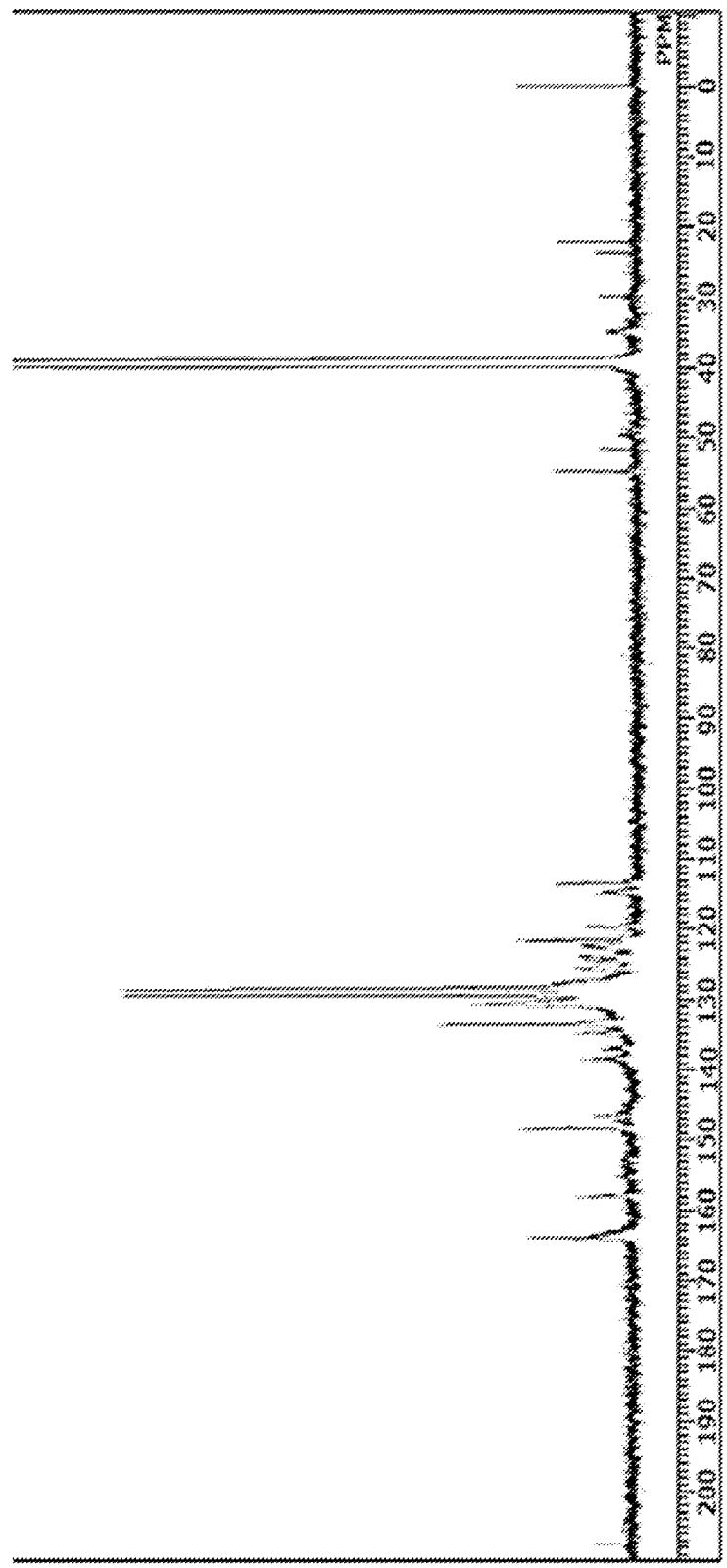
FIG. 10 is a $^{13}$C-NMR chart of the active ester resin (A-1) obtained in Example 1.

Into a flask equipped with a thermometer, a dropping funnel, a cooling tube, a distillation tube, and a stirrer, 228 g of the phenolic resin (A1-1) obtained in Production Example 1 and 980 g of methyl isobutyl ketone were charged and the system was purged with nitrogen at a reduced pressure to dissolve the resin. Then 10.1 g (0.05 mol) of isophthalic acid chloride and 126 g (0.9 mol) of benzoyl chloride were charged. While the system was controlled to 60° C. or less under nitrogen gas purging, 240 g of a 20% sodium hydroxide aqueous solution was added dropwise for 3 hours. Under the same conditions, stirring was continued for 1.0 hour. Upon completion of the reaction, the mixture was left to stand still to separate and the water layer was removed. Water was added to the methyl isobutyl ketone phase dissolving the reaction product and the resulting mixture was stirred and mixed for about 15 minutes. Then the mixture was left to stand still to separate and the water layer was removed. This operation was repeated until the pH value of the water layer was 7. After removing water by decanting, methyl isobutyl ketone was removed by reduced pressure dehydration and an active ester resin (A-1) was obtained. The softening point of the active ester resin (A-1) was 140° C. The esterification ratio relative to the phenolic hydroxyl groups was 100% and the functional group equivalent calculated from the compositions of the raw materials charged was 328 g/eq. The functional group equivalent of the active ester resin (A) here is a value calculated for ester bonding sites that are present on the aromatic nucleus in the active ester resin (A). The GPC chart of the active ester resin (A-1) is shown in FIG. 8, the MS spectrum is shown in FIG. 9, and the $^{13}$C-NMR chart is shown in FIG. 10. It was confirmed from the transition of the MS spectrum compared to the phenolic resin (A1-1) obtained in Production Example 1 that the active ester resin (A-1) is a resin in which the resin components contained in the phenolic resin (A1-1) reacted with isophthalic acid chloride and benzoyl chloride while undergoing dehydrochlorination reaction. Moreover, a peak indicating the presence of a carbonyl carbon derived from an ester group was detected at 165 ppm in the $^{13}$C-NMR of the obtained active ester (A-1).

Example 2

An active ester resin (A-2) was obtained by the same method as in Example 1 except that 10.1 g (0.05 mol) of isophthalic acid chloride was changed to 30 g (0.15 mol) of isophthalic acid chloride and 126 g (0.9 mol) of benzoyl chloride was changed to 98 g (0.7 mol) of benzoyl chloride. The softening point of this active ester resin (A-2) was 157° C. The esterification ratio relative to phenolic hydroxyl groups was 100% and the functional group equivalent calculated from the compositions of the raw materials charged was 320 g/eq.

Example 3

Into a flask equipped with a thermometer, a dropping funnel, a cooling tube, a distillation tube, and a stirrer, 250 g of the phenolic compound (A1-2) obtained in Production Example 2 and 1000 g of methyl isobutyl ketone were charged and the system was purged with nitrogen at a reduced pressure to dissolve the resin. Then 10.1 g (0.05 mol) of isophthalic acid chloride and 126 g (0.9 mol) of benzoyl chloride were charged. While the system was controlled to 60° C. or less under nitrogen gas purging, 240 g of a 20% sodium hydroxide aqueous solution was added dropwise for 3 hours. Under the same conditions, stirring was continued for 1.0 hour. Upon completion of the reaction, the mixture was left to stand still to separate and the water layer was removed. Water was added to the methyl isobutyl ketone phase dissolving the reaction product and the resulting mixture was stirred and mixed for about 15 minutes. Then the mixture was left to stand still to separate and the water layer was removed. This operation was repeated until the pH value of the water layer was 7. After removing water by decanting, methyl isobutyl ketone was removed by reduced pressure dehydration and an active ester resin (A-3) was obtained. The softening point of the active ester resin (A-3) was 143° C. The esterification ratio relative to the phenolic hydroxyl groups was 100% and the functional group equivalent calculated from the compositions of the raw materials charged was 350 g/eq. It was confirmed from the transition of the MS spectrum compared to the phenolic resin (A1-2) obtained in Production Example 2 that the active ester resin (A-3) is a resin in which the resin components contained in the phenolic compound (A1-2) reacted with benzoyl chloride while undergoing dehydrochlorination reaction.

Example 4

Into a flask equipped with a thermometer, a dropping funnel, a cooling tube, a distillation tube, and a stirrer, 232 g of the phenolic compound (A1-3) obtained in Production Example 3 and 995 g of methyl isobutyl ketone were charged and the system was purged with nitrogen at a reduced pressure to dissolve the resin. Then 10.1 g (0.05 mol) of isophthalic acid chloride and 119 g (0.85 mol) of benzoyl chloride were charged. While the system was controlled to 60° C. or less under nitrogen gas purging, 240 g of a 20% sodium hydroxide aqueous solution was added dropwise for 3 hours. Under the same conditions, stirring was continued for 1.0 hour. Upon completion of the reaction, the mixture was left to stand still to separate and the water layer was removed. Water was added to the methyl isobutyl ketone phase dissolving the reaction product and the resulting mixture was stirred and mixed for about 15 minutes. Then the mixture was left to stand still to separate and the water layer was removed. This operation was repeated until the pH value of the water layer was 7. After removing water by decanting, methyl isobutyl ketone was removed by reduced pressure dehydration and an active ester resin (A-4) was obtained. The softening point of the active ester resin (A-4) was 100° C. The esterification ratio relative to the phenolic hydroxyl groups was 95% and the functional group equivalent calculated from the compositions of the raw materials charged was 327 g/eq. It was confirmed from the transition of the MS spectrum compared to the phenolic resin (A1-3) obtained in Production Example 3 that the active ester resin (A-4) is a resin in which the resin components contained in the phenolic compound (A1-3) reacted with benzoyl chloride while undergoing dehydrochlorination reaction.

Comparative Example 1

Into a flask equipped with a thermometer, a dropping funnel, a cooling tube, a distillation tube, and a stirrer, 104 g of the phenolic compound (A1'-1) obtained in Comparative Production Example 2 and 600 g of methyl isobutyl ketone were charged and the system was purged with nitrogen at a reduced pressure to dissolve the resin. Then 126 g (0.9 mol) of benzoyl chloride was charged. While the system was controlled to 60° C. or less under nitrogen gas purging, 205 g of a 20% sodium hydroxide aqueous solution was added dropwise for 3 hours. Under the same conditions, stirring was continued for 1.0 hour. Upon completion of the reaction, the mixture was left to stand still to separate and the water layer was removed. Water was added to the methyl isobutyl ketone phase dissolving the reaction product and the resulting mixture was stirred and mixed for about 15 minutes. Then the mixture was left to stand still to separate and the water layer was removed. This operation was repeated until the pH value of the water layer was 7. After removing water by decanting, methyl isobutyl ketone was removed by reduced pressure dehydration and an active ester resin (A'-1) was obtained. The softening point of the active ester resin (A'-1) was 100° C. The esterification ratio relative to the phenolic hydroxyl groups was 100% and the functional group equivalent calculated from the compositions of the raw materials charged was 197 g/eq. It was confirmed from the transition of the MS spectrum compared to the phenolic resin (A1'-1) obtained in Comparative Production Example 2 that the active ester resin (A'-1) is a resin in which the resin components contained in the phenolic resin (A1'-1) reacted with benzoyl chloride while undergoing dehydrochlorination reaction.

Comparative Example 2

An attempt was made to react the phenolic resin (A1'-2) obtained in Comparative Production Example 3 with benzoyl chloride by the same method as in Examples. However, the phenolic resin (A1'-2) did not dissolve in methyl isobutyl ketone and the reaction product could not be obtained.

Comparative Example 3

An active ester resin (A'-2) (188 g) was obtained by the same method as in Example 1 except that 228 g of the phenolic resin (A1-1) was changed to 105 g of a phenol novolac resin ("TD-2090" produced by DIC Corporation, hydroxyl equivalent: 105 g/eq) and that 205 g of the 20% sodium hydroxide aqueous solution was changed to 189 g of the 20% sodium hydroxide aqueous solution. The functional group equivalent calculated from the compositions of the raw materials charged was 199 g/eq.

Preparation of Thermosetting Resin Composition

A thermosetting resin composition was prepared in accordance with the formulation described in Table 1 by mixing an active ester resin (A), an epoxy resin (B) [phenol novolac-type epoxy resin ("N-770" produced by DIC Corporation, epoxy equivalent: 183 g/eq)], 0.05 phr of a curing catalyst (dimethylaminopyridine), and methyl ethyl ketone so that the non-volatile content (N.V.) of the composition at the final stage was 58% by mass.

Then a sample laminate was made by curing under conditions described below. The heat resistance, dielectric properties, and flame retardancy were evaluated by the following methods. The results are shown in Table 1.

<Laminate Preparation Conditions>
  Substrate: glass cloth "#2116" (210×280 mm) produced by Nitto Boseki Co., Ltd.
  Number of plies: 6
  Prepreg forming conditions: 160° C.
  Curing condition: 200° C., 40 kg/cm² for 1.5 hours
  Thickness after forming: 0.8 mm <Heat Resistance (Glass Transition Temperature)>
  The temperature at which the change in elastic modulus was maximum (rate of change in tan δ was the largest) measured by a viscoelasticity meter (DMA: Solid analyzer RSA II produced by Rheometrics, Inc., rectangular tension method, frequency: 1 Hz, heating rate: 3° C./min) was assumed to be the glass transition temperature.

<Heat Resistance (Heat Delamination Resistance)>
  T288: The test method and evaluation were as provided in IPC TM650.

<Measurement of Dielectric Constant and Loss Tangent>
  The dielectric constant and loss tangent at 1 GHz of a test piece oven-dried and then stored in a room at 23° C. and a humidity of 50% for 24 hours were measured by a cavity resonance method in accordance with JIS-C-6481 by using a network analyzer "E8362C" produced by Agilent Technologies.

<Flame Retardancy>
  A flame test was conducted in accordance with UL-94 testing method on five test pieces having a thickness of 0.8 mm.

TABLE 1

|  |  | Example 1 | Example 2 | Example 3 | Example 4 | Comparative Example 1 | Comparative Example 2 |
|---|---|---|---|---|---|---|---|
| Active ester resin | A-1 | 64.2 |  |  |  |  |  |
|  | A-2 |  | 62.0 |  |  |  |  |
|  | A-3 |  |  | 65.7 |  |  |  |
|  | A-4 |  |  |  | 64.1 |  |  |
|  | A'-1 |  |  |  |  | 51.8 |  |
|  | A'-2 |  |  |  |  |  | 52.1 |
| Epoxy | N-770 | 35.8 | 38.0 | 34.3 | 35.9 | 48.2 | 47.9 |
| Heat resistance (° C.) |  | 177 | 182 | 195 | 163 | 139 | 131 |
| Dielectric constant (1 GHz) |  | 3.4 | 3.4 | 3.5 | 3.4 | 4.5 | 4.6 |
| Loss tangent (1 GHz) |  | 0.005 | 0.004 | 0.005 | 0.005 | 0.018 | 0.017 |
| Heat delamination resistance (T288) (min) |  | >60 | >60 | >60 | >60 | 0 | 0 |
| Flame test class |  | V-1 | V-1 | V-1 | V-1 | Burned | Burned |
| 1* |  | 15 | 24 | 20 | 19 | 32 | 37 |
| 2* |  | 65 | 87 | 75 | 74 | 165 | 158 |

Legends in Table 1 are as follows:
A-1: active ester resin (A-1) obtained in Example 1
A-2: active ester resin (A-2) obtained in Example 2
A-3: active ester resin (A-3) obtained in Example 3
A-4: active ester resin (A-4) obtained in Example 4
A'-1: active ester resin (A'-1) obtained in Comparative Example 1
A'-2: active ester resin (A'-2) obtained in Comparative Example 2
N-770: phenol novolac-type epoxy resin ("N-770" produced by DIC Corporation, epoxy equivalent: 183 g/eq.)
*1: Maximum burning time (sec) by impinging flame once
*2: Total burning time (sec) of five test pieces

The invention claimed is:
1. An active ester resin having one resin structure selected from the group consisting of:
a resin structure obtained by reacting a phosphorus-containing phenolic compound (A1x) having a structural segment (i) represented by structural formula (I) below:

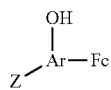
(I)

Ar represents a benzene ring or a naphthalene ring, Fc represents a hydrogen atom or a hydroxyl group, and Z represents a structural segment selected from the group consisting of partial structures represented by structural formula z1 or z3 below:

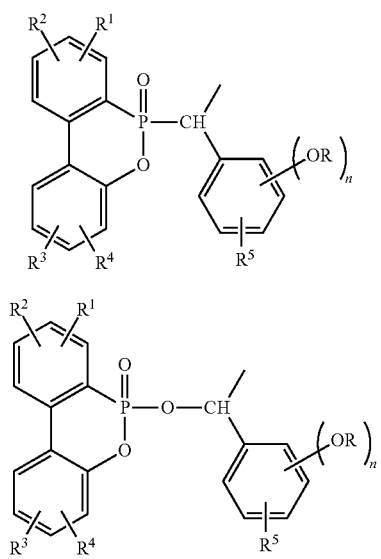

with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that hydroxyl groups in the structural segment (i) form ester bonds, the resin structure having two structural segments (i) bonded to each other via an ester residue of the (A2);
a resin structure obtained by reacting a phosphorus-containing phenolic resin (A1y) having a novolac phenolic resin structure and having, as a substituent on an aromatic nucleus, a structural segment selected from the group consisting of partial structures represented by the structural formula z1 or z3 with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phosphorus-containing phenolic resin (A1y) form ester bonds, the resin structure having two hydroxyl groups bonded to each other via an ester residue of the (A2); and
a resin structure obtained by reacting a phosphorus-containing phenolic resin (A1z) having a structural segment (ii) selected from the group consisting of partial structures represented by structural formula (II) below:

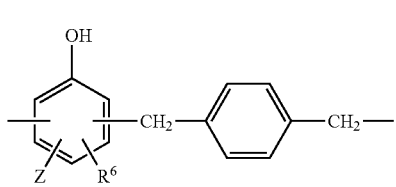
(II)

wherein R⁶ represents a hydrogen atom or a C1-6 alkyl group, Z represents a structural segment selected from the group consisting of a hydrogen atom and partial structures represented by the structural formula z1 or z3;
wherein at least one of the Z represents a structural segment selected from the partial structures represented by the structural formula z1 or z3 with an aromatic dicarboxylic acid or an anhydride or dihalide of an aromatic dicarboxylic acid or a C2-6 saturated dicarboxylic acid or an anhydride or dihalide of a C2-6 saturated dicarboxylic acid (A2) so that all or some of hydroxyl groups of the phosphorus-containing phenolic resin (A1z) form ester bonds, the resin structure having two hydroxyl groups bonded to each other via an ester residue of the (A2);
wherein in the structural formula z1 or z3 above, $R^1$, $R^2$, $R^3$, and $R^4$ each independently represent a hydrogen atom, a C1-5 alkyl group, a chlorine atom, a bromine atom, a phenyl group, or an aralkyl group, $R^5$ represents a hydrogen atom or a C1-5 alkyl group, R represents a C1-4 alkyl group, and n represents the number of substituents OR on an aromatic nucleus and is in the range of 1 to 3.

2. The active ester resin according to claim 1, wherein the Fc in the structural formula (I) represents the hydroxyl group and the active ester resin has the resin structure in which one of hydroxyl groups in the structural segment (i) is reacted with the aromatic dicarboxylic acid or the anhydride or dihalide of the aromatic dicarboxylic acid or the C2-6 saturated dicarboxylic acid or the anhydride or dihalide of the C2-6 saturated dicarboxylic acid (A2) so as to form the ester bond and bond the two structural segments (i) to each other via the ester residue of the (A2) and in which the other hydroxyl group in the structural segment (i) is reacted with an aromatic monocarboxylic acid or a halide thereof or a C2-6 saturated aliphatic acid or a halide or anhydride thereof (A3) so as to form an ester bond.

3. The active ester resin according to claim 1, wherein some of the hydroxyl groups of the phosphorus-containing phenolic resin (A1y) are reacted with the aromatic dicarboxylic acid or the anhydride or dihalide of the aromatic dicarboxylic acid or the C2-6 saturated dicarboxylic acid or the anhydride or dihalide of the C2-6 saturated dicarboxylic acid (A2) so as to form the ester bonds and bond the two hydroxyl groups to each other via the ester residue of the (A2) and in which all or some of the rest of the hydroxyl groups of the phenolic resin (A1y) are reacted with an aromatic monocarboxylic acid or a halide thereof or a C2-6 saturated aliphatic acid or a halide or anhydride thereof (A3) so as to form ester bonds.

4. The active ester resin according to claim 1, wherein some of the hydroxyl groups of the phosphorus-containing phenolic resin (A1z) are reacted with the aromatic dicarboxylic acid or the anhydride or dihalide of the aromatic dicarboxylic acid or the C2-6 saturated dicarboxylic acid or the anhydride or dihalide of the C2-6 saturated dicarboxylic acid (A2) so as to form ester the bonds and bond the two hydroxyl groups to each other via the ester residue of the (A2) and in which all or some of the rest of hydroxyl groups of the phenolic resin (A1z) are reacted with an aromatic monocarboxylic acid or a halide thereof or a C2-6 saturated aliphatic acid or a halide or anhydride thereof (A3) so as to form ester bonds.

5. A thermosetting resin composition containing the active ester resin according to claim 1 and an epoxy resin as essential components.

6. The thermosetting resin composition according to claim 5, wherein a blend ratio of the active ester resin to the epoxy resin is such that a total of hydroxyl groups and ester bonding sites on the aromatic nucleus in the active ester resin relative to a total of 1 equivalent of epoxy groups in the epoxy resin is 0.7 to 1.5 equivalents.

7. A cured product obtained by curing the thermosetting resin composition according to claim 5.

8. A circuit board obtained by preparing a varnish by diluting the thermosetting resin composition according to claim 5 with an organic solvent and thermally press-forming a copper film and a plate prepared by shaping the resulting varnish.

9. A build-up film characterized in that the thermosetting resin composition according to claim 5 diluted with an organic solvent is applied to a substrate film and dried.

\* \* \* \* \*